(12) United States Patent
Lee et al.

(10) Patent No.: US 11,243,629 B2
(45) Date of Patent: Feb. 8, 2022

(54) TOUCH DISPLAY DEVICE

(71) Applicant: LG Display Co., Ltd., Seoul (KR)

(72) Inventors: Yangsik Lee, Paju-si (KR); HwiDeuk Lee, Paju-si (KR); YongChan Park, Paju-si (KR); Sungsu Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/018,890

(22) Filed: Sep. 11, 2020

(65) Prior Publication Data
US 2021/0141479 A1    May 13, 2021

(30) Foreign Application Priority Data
Nov. 12, 2019  (KR) .................. 10-2019-0144197

(51) Int. Cl.
*G06F 3/041*    (2006.01)
*H01L 27/32*    (2006.01)
*G06F 3/044*    (2006.01)

(52) U.S. Cl.
CPC ........ *G06F 3/0412* (2013.01); *G06F 3/04164* (2019.05); *H01L 27/323* (2013.01); *G06F 3/044* (2013.01); *G06F 2203/04107* (2013.01)

(58) Field of Classification Search
CPC .... G06F 3/0412; G06F 3/04164; G06F 3/044; G06F 2203/04107; H01L 27/323
See application file for complete search history.

(56) References Cited

U.S. PATENT DOCUMENTS

2018/0145114 A1   5/2018  Sim et al.
2018/0203555 A1   7/2018  Miyamoto
2019/0237533 A1*  8/2019  Kim .................. H01L 27/323

FOREIGN PATENT DOCUMENTS

EP          3522229 A1    8/2019

OTHER PUBLICATIONS

Combined Search and Examination Report, UK Patent Application No. 2015241.9, dated Apr. 21, 2021, nine pages.

* cited by examiner

Primary Examiner — Peter D McLoone
(74) Attorney, Agent, or Firm — Fenwick & West LLP

(57) ABSTRACT

Embodiments of the disclosure relate to touch display devices. A shielding pattern to which a constant voltage is applied is placed between the touch routing line and the encapsulation part without overlapping the touch routing line. Thus, it is possible to block the noise due to the signal line positioned under the encapsulation part by the electric field generated by the shielding pattern. Further, the metal disposed on the same layer as the shielding pattern in the planarized area of the encapsulation part may be used as a touch routing line, reducing the resistance and width of the touch routing line and hence the planarized area of the encapsulation part. Thus, it is possible to provide a touch display device for which an increase in the non-active area has been reduced and display noise has been reduced upon touch sensing.

15 Claims, 21 Drawing Sheets

TOUCH DISPLAY DEVICE

CROSS-REFERENCE TO RELATED APPLICATION

This application claims priority from Republic of Korea Patent Application No. 10-2019-0144197, filed on Nov. 12, 2019, which is hereby incorporated by reference in its entirety.

BACKGROUND

Field

Embodiments of the disclosure relate to touch display devices.

Description of Related Art

The growth of the intelligent society leads to increased demand for image display devices and use of various types of display devices, such as liquid crystal displays, organic light emitting displays, etc.

The display device recognizes the user's touch on the display panel and performs input processing based on the recognized touch so as to provide more various functions to the user.

As an example, a display device capable of touch recognition may include a plurality of touch electrodes arranged or embedded in a display panel. Whether there is the user's touch on the display panel and coordinates of a touch may be detected by driving the touch electrodes.

To display images and provide touch sensing functions, the display panel may include display driving lines and touch sensing lines. In some cases, the display driving lines and the touch sensing lines may overlap each other or be positioned adjacent to each other. Thus, parasitic capacitance between the two kinds of lines may deteriorate the performance of touch sensing.

SUMMARY

According to an embodiment, there is provided a method for enhancing the performance of touch sensing by reducing touch sensing signal noise due to the parasitic capacitance between the display driving line and the touch driving line.

According to an embodiment, there is provided a method for reducing touch sensing signal noise while reducing the area needed to place touch driving lines.

According to an embodiment, a touch display device comprises a plurality of light emitting elements arranged in an active area, a plurality of signal lines arranged in a non-active area positioned outside the active area, an encapsulation part disposed on the light emitting elements and the signal lines, a plurality of touch electrodes arranged in the active area on the encapsulation part, a plurality of touch routing lines arranged in the non-active area on the encapsulation part and electrically connected with the touch electrodes, and at least one shielding pattern positioned between the touch routing lines and the encapsulation part, arranged in an area except for an area overlapping the touch routing lines, and to which a constant voltage is applied.

According to an embodiment, a touch display device comprises a plurality of light emitting elements arranged in an active area, a plurality of signal lines arranged in a non-active area positioned outside the active area, an encapsulation part disposed on the light emitting elements and the signal lines, a plurality of touch electrodes arranged in the active area on the encapsulation part, a plurality of touch routing lines arranged in the non-active area on the encapsulation part and electrically connected with the touch electrodes, and at least one shielding pattern disposed between an inclined surface of the encapsulation part and the touch routing lines in the non-active area, disposed in an area including an area overlapping the touch routing lines, and to which a signal corresponding to a signal applied to the touch routing lines is applied.

According to an embodiment, a touch display device comprises a plurality of touch electrodes arranged in an active area, a plurality of touch routing lines arranged in a non-active area positioned outside the active area and electrically connected with the touch electrodes, a plurality of signal lines arranged in the non-active area and positioned under the touch routing lines, and at least one shielding pattern positioned between the touch routing lines and the signal lines, arranged in an area except for an area overlapping the touch routing lines, and to which a constant voltage is applied.

According to embodiments of the disclosure, a shielding pattern to which constant voltage is applied may be placed between the touch routing lines and the encapsulation part not to overlap the touch routing lines. Thus, the parasitic capacitance between the signal lines under the encapsulation part and the touch routing lines may be reduced.

The shielding pattern may be disposed to overlap the touch routing lines, and the same signal as the signal applied to the touch routing lines may be supplied to the shielding pattern. Thus, the parasitic capacitance between the signal lines positioned under the encapsulation part and the touch routing lines may be reduced.

The piece of metal disposed on the same layer as the shielding pattern in the planarized area of the encapsulation part may be used as the touch routing line. Thus, the resistance of the touch routing line may be reduced, and the width of the touch routing line disposed in the planarized area of the encapsulation part may be decreased.

Thus, it is possible to reduce deterioration of the touch sensing performance due to the parasitic capacitance between the touch routing line and the display driving signal line while reducing the area required to place the touch routing lines.

BRIEF DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1:
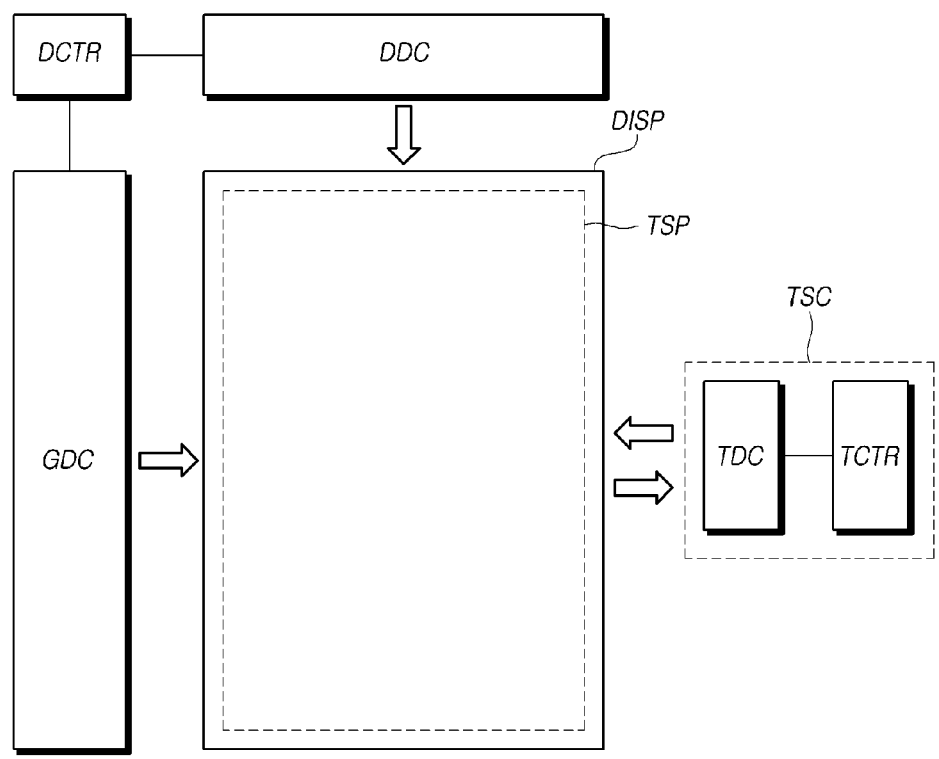
FIG. 1 is a view schematically illustrating a configuration of a touch display device according to an embodiment.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompass all the meanings of the term "can".

FIG. 1 is a view illustrating a system configuration of a touch display device according to an embodiment of the disclosure.

Referring to FIG. 1, according to an embodiment, the touch display device may provide both a function for displaying images and a function for touch sensing.

According to an embodiment, to provide the image display function, the touch display device may include a display panel DISP, where a plurality of data lines and a plurality of gate lines are arranged, and a plurality of subpixels defined by the plurality of data lines and the plurality of gate lines are arranged, a data driving circuit DDC for driving the plurality of data lines, a gate driving circuit GDC for driving the plurality of gate lines, and a display controller DCTR for controlling the data driving circuit DDC and the gate driving circuit GDC.

The data driving circuit DDC, the gate driving circuit GDC, and the display controller DCTR each may be implemented as one or more individual components. In some cases, two or more of the data driving circuit DDC, the gate driving circuit GDC, and the display controller DCTR may be integrated into a single component. For example, the data driving circuit DDC and the display controller DCTR may be implemented as a single integrated circuit (IC) chip.

According to an embodiment, to provide the touch sensing function, the touch display device may include a touch panel TSP including a plurality of touch electrodes and a touch sensing circuit TSC supplying touch driving signals to the touch panel TSP, detecting touch sensing signals from the touch panel TSP, and sensing whether there is the user's touch or the position of a touch (touch coordinates) on the touch panel TSP based on the detected touch sensing signals.

As an example, the touch sensing circuit TSC may include a touch driving circuit TDC supplying touch driving signals to the touch panel TSP and detecting touch sensing signals from the touch panel TSP and a touch controller TCTR sensing whether there is the user's touch on the touch panel TSP and/or the position of a touch based on the touch sensing signal detected by the touch driving circuit TDC.

The touch driving circuit TDC may include a first circuit part supplying touch driving signals to the touch panel TSP and a second circuit part detecting touch sensing signals from the touch panel TSP.

The touch driving circuit TDC and the touch controller TCTR may be implemented as separate components or, in some cases, be integrated into a single component.

The data driving circuit DDC, the gate driving circuit GDC, and the touch driving circuit TDC each may be implemented as one or more integrated circuits and, in light of electrical connection with the display panel DISP, they may be implemented in a chip-on-glass (COG) type, chip-on-film (COF) type, or tape-carrier-package (TCP) type. The gate driving circuit GDC may also be implemented in a gate-in-panel (GIP) type.

The circuit components (DDC, GDC, and DCTR) for display driving and the circuit components (TDC and TCTR) for touch sensing each may be implemented as one or more individual components. In some cases, one or more of the circuit components (DDC, GDC, and DCTR) for display driving and one or more of the circuit components (TDC and TCTR) for touch sensing may be functionally integrated into one or more components.

For example, the data driving circuit DDC and the touch driving circuit TDC may be integrated into one or two or more integrated circuit chips. Where the data driving circuit DDC and the touch driving circuit TDC are integrated into two or more integrated circuit chips, each of the two or more integrated circuit chips may have the data driving function and the touch driving function.

According to an embodiment, the touch display device may come in various types, e.g., as an organic light emitting display device or a liquid crystal display device. In the following example, the touch display device is an organic light emitting display device for ease of description. In other words, although the display panel DISP comes in various types, e.g., as an organic light emitting display panel or a liquid crystal display panel, an example is described below in which the display panel DISP is an organic light emitting display panel for ease of description.

As described below, the touch panel TSP may include a plurality of touch electrodes to which touch driving signals are applied or from which touch sensing signals may be detected and a plurality of touch routing lines for connecting the plurality of touch electrodes with the touch driving circuit TDC.

The touch panel TSP may be present outside the display panel DISP. In other words, the touch panel TSP and the display panel DISP may be separately manufactured and then combined together. Such touch panel TSP is referred to as an external type or add-on type.

Unlike this, the touch panel TSP may be embedded in the display panel DISP. In other words, when the display panel DISP is manufactured, the touch sensor structure of, e.g., the plurality of touch electrodes and the plurality of touch routing lines constituting the touch panel TSP, may be formed along with signal lines and electrodes for display driving. Such touch panel TSP is referred to as an embedded type. In the following example, the touch panel TSP is formed in the embedded type for ease of description.

Figure 2:
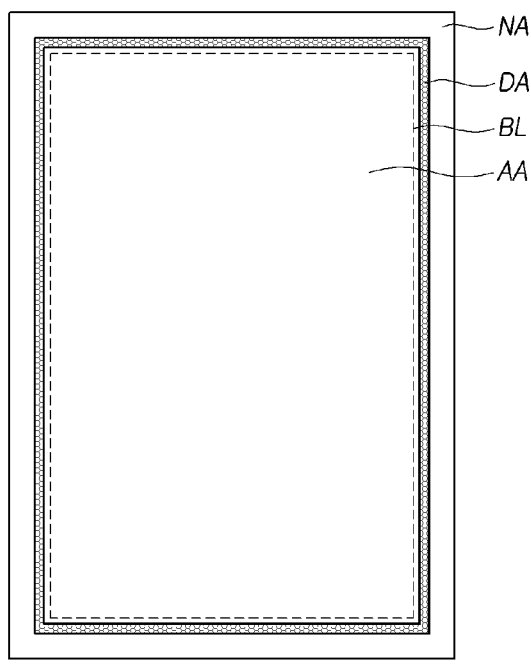
FIG. 2 is a view schematically illustrating a display panel of a touch display device according to an embodiment.

FIG. 2 is a view schematically illustrating a display panel DISP of a touch display device according to an embodiment.

Referring to FIG. 2, the display panel DISP may include an active area AA, where images are displayed, and a non-active area NA, which is an area around the outer border line BL of the active area AA.

In the active area AA of the display panel DISP, a plurality of subpixels for displaying images are arranged, and various electrodes or signal lines for display driving are arranged.

In the active area AA of the display panel DISP, a plurality of touch electrodes for touch sensing and a plurality of touch routing lines electrically connected with the touch electrodes may be arranged. Thus, the active area AA may also be referred to as a touch sensing area where touch sensing is possible.

In the non-active area NA of the display panel DISP, link lines, which are extensions of various signal lines arranged in the active area AA, or link lines electrically connected with various signal lines arranged in the active area AA, and pads electrically connected with the link lines may be arranged. The pads arranged in the non-active area NA may be bonded or electrically connected with the display driving circuit (e.g., DDC or GDC).

In the non-active area NA of the display panel DISP, link lines, which are extensions of the plurality of touch routing lines arranged in the active area AA, or link lines electrically connected with the plurality of touch routing lines arranged in the active area AA, and pads electrically connected with the link lines may be arranged. The pads arranged in the non-active area NA may be bonded or electrically connected with the touch driving circuit TDC.

In the non-active area NA, partial extensions of the outermost touch electrodes among the plurality of touch electrodes arranged in the active area AA may be present, and one or more electrodes (touch electrodes) which are formed of the same material as the plurality of touch electrodes arranged in the active area AA may further be disposed.

In other words, the plurality of touch electrodes arranged on the display panel DISP may all be present in the active area AA, or some (e.g., the outermost touch electrodes) of the plurality of touch electrodes arranged in the display panel DISP may be present in the non-active area NA, or some (e.g., the outermost touch electrodes) of the plurality of touch electrodes arranged on the display panel DISP may be provided over the active area AA and the non-active area NA.

Referring to FIG. 2, according to an embodiment, the display panel DISP of the touch display device may include a dam area DA where a dam DAM is placed to reduce collapsing of any layer (e.g., the encapsulation part in the organic light emitting display panel) in the active area AA.

The dam area DA may be positioned at the border between the active area AA and the non-active area NA or at any point in the non-active area NA which is positioned around the active area AA.

The dam disposed in the dam area DA may be disposed to surround the active area AA in all directions or be disposed around only one or two or more portions (e.g., portions with a layer which may easily collapse) in the active area AA.

The dam disposed in the dam area DA may be constituted of a single continuous pattern or two or more dams separated from each other. Only a primary dam, two dams (the primary dam and a secondary dam), or three or more dams may be disposed in the dam area DA.

In the dam area DA, the primary dam may be present in any one direction, or the primary dam and the secondary dam all may be present in any one direction.

Figure 3:
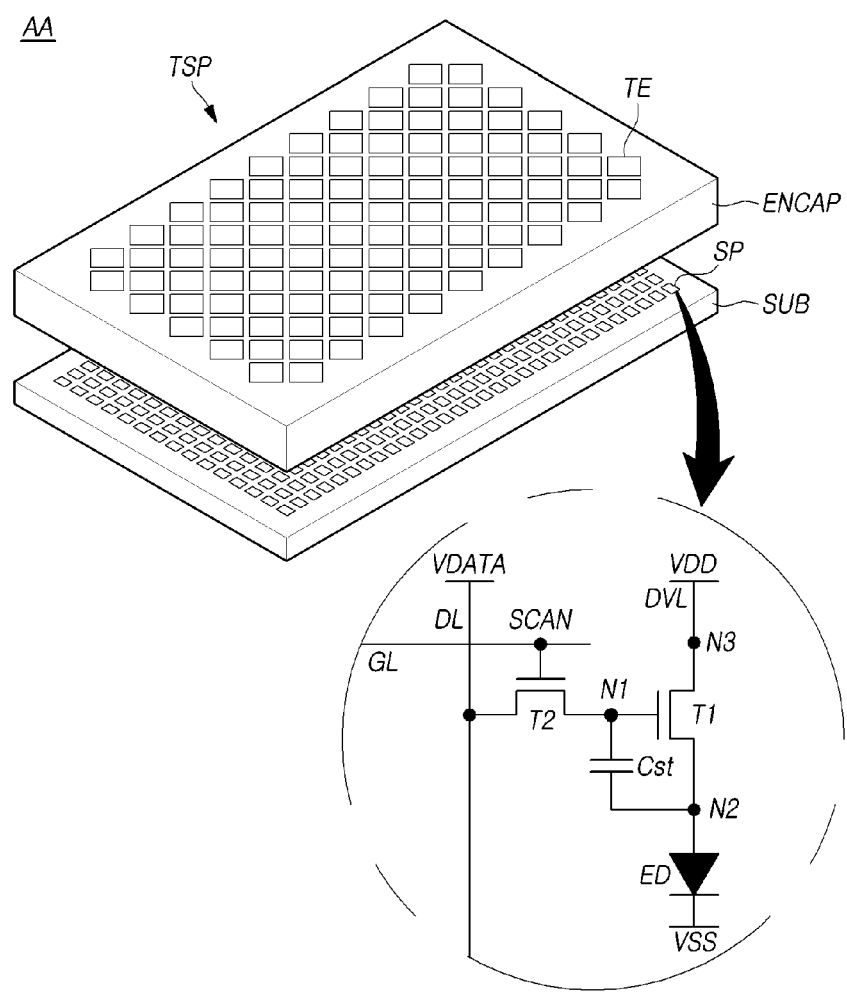
FIG. 3 is a view illustrating an example structure in which a touch panel is embedded in a display panel according to an embodiment.

FIG. 3 is a view illustrating an example structure in which a touch panel TSP is embedded in a display panel DISP according to an embodiment.

Referring to FIG. 3, in the active area AA of the display panel DISP, a plurality of subpixels SP may be arranged on the substrate SUB.

Each subpixel SP may include a light emitting element ED, a first transistor T1 for driving the light emitting element, a second transistor T2 for transferring a data voltage VDATA to a first node N1 of the first transistor T1, and a storage capacitor Cst for maintaining a constant voltage during one frame.

The first transistor T1 may include the first node N1 to which the data voltage VDATA may be applied, a second node N2 electrically connected with the light emitting element ED, and a third node N3 to which a driving voltage VDD is applied from a driving voltage line DVL. The first node N1 may be a gate node, the second node N2 may be a source node or a drain node, and the third node N3 may be the drain node or the source node. The first transistor T1 is referred to as a driving transistor for driving the light emitting element ED.

The light emitting element ED may include a first electrode (e.g., an anode electrode), a light emitting layer, and a second electrode (e.g., a cathode electrode). The first electrode may be electrically connected with the second node N2 of the first transistor T1, and a base voltage VSS may be applied to the second electrode.

The light emitting layer in the light emitting element ED may be an organic light emitting layer containing an organic material. In this case, the light emitting element ED may be an organic light emitting diode (OLED).

The second transistor T2 may be on/off controlled by a scan signal SCAN applied via the gate line GL and be electrically connected between the first node N1 of the first transistor T1 and the data line DL. The second transistor T2 is referred to as a switching transistor.

If the second transistor T2 is turned on by the scan signal SCAN, the data voltage VDATA supplied from the data line DL is transferred to the first node N1 of the first transistor T1.

The storage capacitor Cst may be electrically connected between the first node N1 and second node N2 of the first transistor T1.

Each subpixel SP may have a 2T1C structure which includes two transistors T1 and T2 and one capacitor Cst as shown in FIG. 3 and, in some cases, each subpixel SP may further include one or more transistors or one or more capacitors.

The storage capacitor Cst may be not the parasitic capacitor (e.g., Cgs or Cgd), the internal capacitor which may be present between the first node N1 and second node N2 of the first transistor T1, but an external capacitor intentionally designed outside the first transistor T1.

Each of the first transistor T1 and the second transistor T2 may be an n-type transistor or a p-type transistor.

As described above, circuit elements, such as the light emitting element ED, two or more transistors T1 and T2, and one or more capacitors Cst, are disposed on the display panel DISP. Since such circuit elements (particularly, the light emitting element ED) are vulnerable to external moisture or oxygen, an encapsulation part ENCAP may be disposed on the display panel DISP to reduce penetration of external moisture or oxygen into the circuit elements (particularly, the light emitting element ED).

The encapsulation part ENCAP may be a single layer or may include multiple layers.

In the touch display device according to an embodiment, the touch panel TSP may be formed on the encapsulation part ENCAP.

In other words, in the touch display device, the touch sensor structure, e.g., the plurality of touch electrodes TE constituting the touch panel TSP, may be disposed on the encapsulation part ENCAP.

Upon touch sensing, a touch driving signal or touch sensing signal may be applied to the touch electrode TE. Thus, upon touch sensing, an electric potential may be formed between the cathode electrode and the touch electrode TE disposed, with the encapsulation part ENCAP interposed therebetween, causing unnecessary parasitic capacitance. Since the parasitic capacitance may deteriorate touch sensitivity, the distance between the touch electrode TE and the cathode electrode may be designed to be a predetermined value (e.g., 1 µm) or more considering, e.g., panel thickness, panel manufacturing process, and display performance, so as to reduce the parasitic capacitance. To that end, the thickness of the encapsulation part ENCAP may be at least 1 µm or more, as an example.

Figure 4:
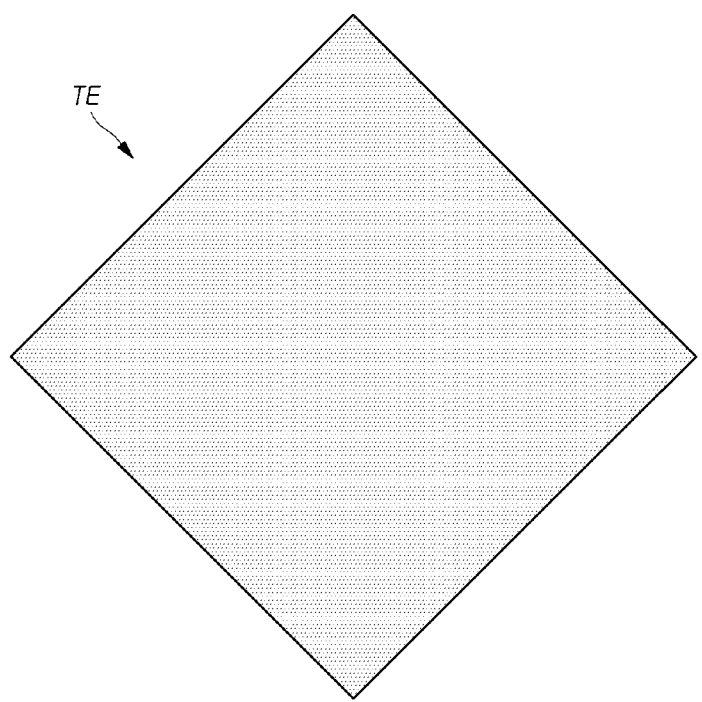
FIGS. 4 and 5 are views illustrating example types of touch electrodes disposed on a display panel according to an embodiment.
Figure 5:
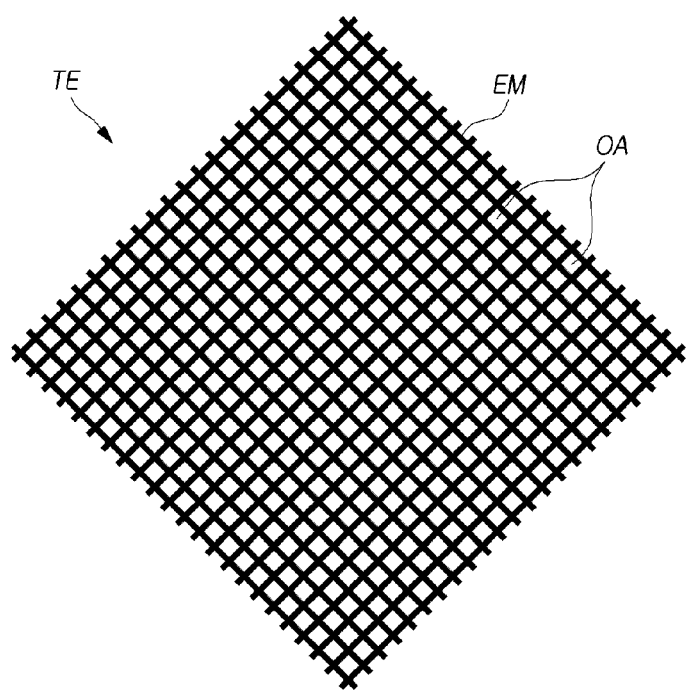

FIGS. 4 and 5 are views illustrating example types of touch electrodes TE disposed on a display panel DISP according to an embodiment.

As shown in FIG. 4, each touch electrode TE disposed on the display panel DISP may be a plate-shape electrode metal with no opening. In this case, each touch electrode TE may be a transparent electrode. In other words, each touch electrode TE may be formed of a transparent electrode material to allow the light emitted from the plurality of subpixels SPs disposed thereunder to be transmitted upwards.

Unlike this, each touch electrode TE disposed on the display panel DISP may be an electrode metal EM with two or more openings OA, which is patterned in a mesh type.

The electrode metal EM is a part corresponding to the substantial touch electrode TE, to which the touch driving signal is applied or from which the touch sensing signal is detected.

As shown in FIG. 5, where each touch electrode TE is an electrode metal EM patterned in a mesh type, two or more openings OA may be present in the area of the touch electrode TE.

Each of the two or more openings OA present in each touch electrode TE may correspond to the light emitting area of one or more subpixels SP. In other words, the plurality of openings OA serve as a path along which the light emitted from the plurality of subpixels SP disposed thereunder are passed upwards. An example in which each touch electrode TE is a mesh-type electrode metal EM is described below for ease of description.

The electrode metal EM corresponding to each touch electrode TE may be positioned on the bank which is disposed in a non-light emitting area of the two or more subpixels SP.

As a method for forming several touch electrodes TE, after the electrode metal EM is formed broad in a mesh type, the electrode metal EM may be cut into a predefined pattern to electrically separate the electrode metal EM, forming several touch electrodes TE.

The contour of the touch electrode TE may be shaped as a diamond or rhombus as shown in FIGS. 4 and 5, or may come in other various shapes, such as a triangle, pentagon, or hexagon.

Figure 6:
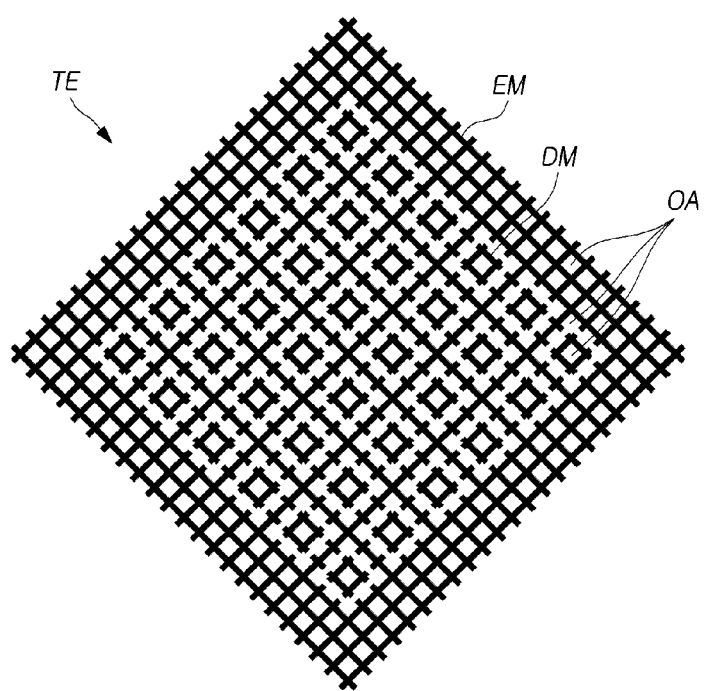
FIG. 6 is a view illustrating an example mesh-type touch electrode as shown in FIG. 5 according to an embodiment.

FIG. 6 is a view illustrating an example mesh-type touch electrode TE as shown in FIG. 5.

Referring to FIG. 6, in the area of each touch electrode TE, one or more dummy metals DM disconnected from the mesh-type electrode metal EM may be present.

The electrode metal EM is a part corresponding to the substantial touch electrode TE and is a part to which the touch driving signal is applied or from which the touch sensing signal is detected. The dummy metal DM, although present in the area of the touch electrode TE, has no touch driving signal applied thereto and no touch sensing signal detected therefrom. In other words, the dummy metal DM may be a metal electrically floated.

Thus, although the electrode metal EM is electrically connected with the touch driving circuit TDC, the dummy metal DM is not electrically connected with the touch driving circuit TDC.

In the area of each of all the touch electrodes TE, one or more dummy metals DM may be present, with them disconnected from the electrode metal EM.

Unlike this, only in the area of each of some of all the touch electrodes TE, one or more dummy metals DM may be present, with them disconnected from the electrode metal EM. In other words, in the area of some touch electrodes TE, no dummy metal DM may be present.

In relation to the role of the dummy metal DM, in the case where one or more dummy metals DM are absent and only the electrode metal EM is present in a mesh type in the area of the touch electrode TE as shown in FIG. 5, a visibility issue may arise in which the contour of the electrode metal EM is shown on the screen.

In contrast, where one or more dummy metals DM are present in the area of the touch electrode TE as shown in FIG. 6, the visibility issue that the contour of the electrode metal EM is shown on the screen may be reduced.

The magnitude of capacitance may be adjusted per touch electrode TE by adjusting the presence or absence of dummy metal DM or the number (dummy metal ratio) of dummy metals DM per touch electrode TE, thereby enhancing touch sensitivity.

The electrode metal EM formed in the area of one touch electrode TE may be cut at some spots, forming the dummy metals DM. In other words, the electrode metal EM and the dummy metal DM may be formed of the same material on the same layer.

According to an embodiment, the touch display device may sense touches based on the capacitance formed at the touch electrode TE.

The touch display device according to embodiments of the disclosure may sense a touch in a mutual capacitance-based touch sensing scheme or self capacitance-based touch sensing scheme, as the capacitance-based touch sensing scheme.

In the mutual-capacitance-based touch sensing scheme, the plurality of touch electrodes TE may be divided into a driving touch electrode (transmission touch electrode) to which the touch driving signal is applied and a sensing touch electrode (reception touch electrode) from which the touch sensing signal is detected and which forms a capacitance with the driving touch electrode.

In the mutual-capacitance-based touch sensing scheme, the touch sensing circuit TSC senses whether there is a touch and/or the coordinates of a touch based on variations in the capacitance (mutual-capacitance) between the driving touch electrode and the sensing touch electrode according to whether there is a pointer, such as a finger or pen.

In the self-capacitance-based touch sensing scheme, each touch electrode TE plays a role both as a driving touch electrode and as a sensing touch electrode. In other words, the touch sensing circuit TSC applies the touch driving signal to one or more touch electrodes TE, detects the touch sensing signal via the touch electrode TE to which the touch driving signal has been applied, grasps a variation in the capacitance between the touch electrode TE and the pointer, e.g., a finger or pen, based on the detected touch sensing signal, and senses whether there is a touch and/or the coordinates of a touch. In the self-capacitance-based touch sensing scheme, the driving touch electrode and the sensing touch electrode are not distinguished from each other.

As such, the touch display device according to embodiments of the disclosure may sense a touch in the mutual capacitance-based touch sensing scheme or self capacitance-based touch sensing scheme. In the following example, the touch display device performs mutual-capacitance-based touch sensing and has a touch sensor structure for the same, for ease of description.

Figure 7:
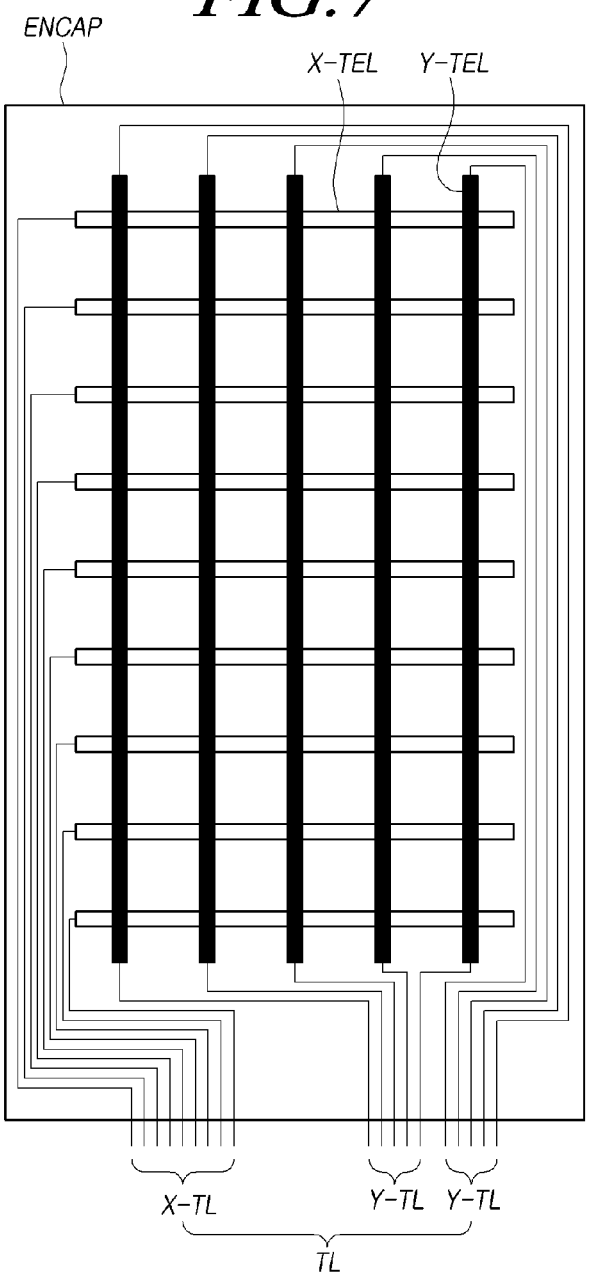
FIG. 7 is a view schematically illustrating a touch sensor structure in a display panel according to an embodiment.
Figure 8:
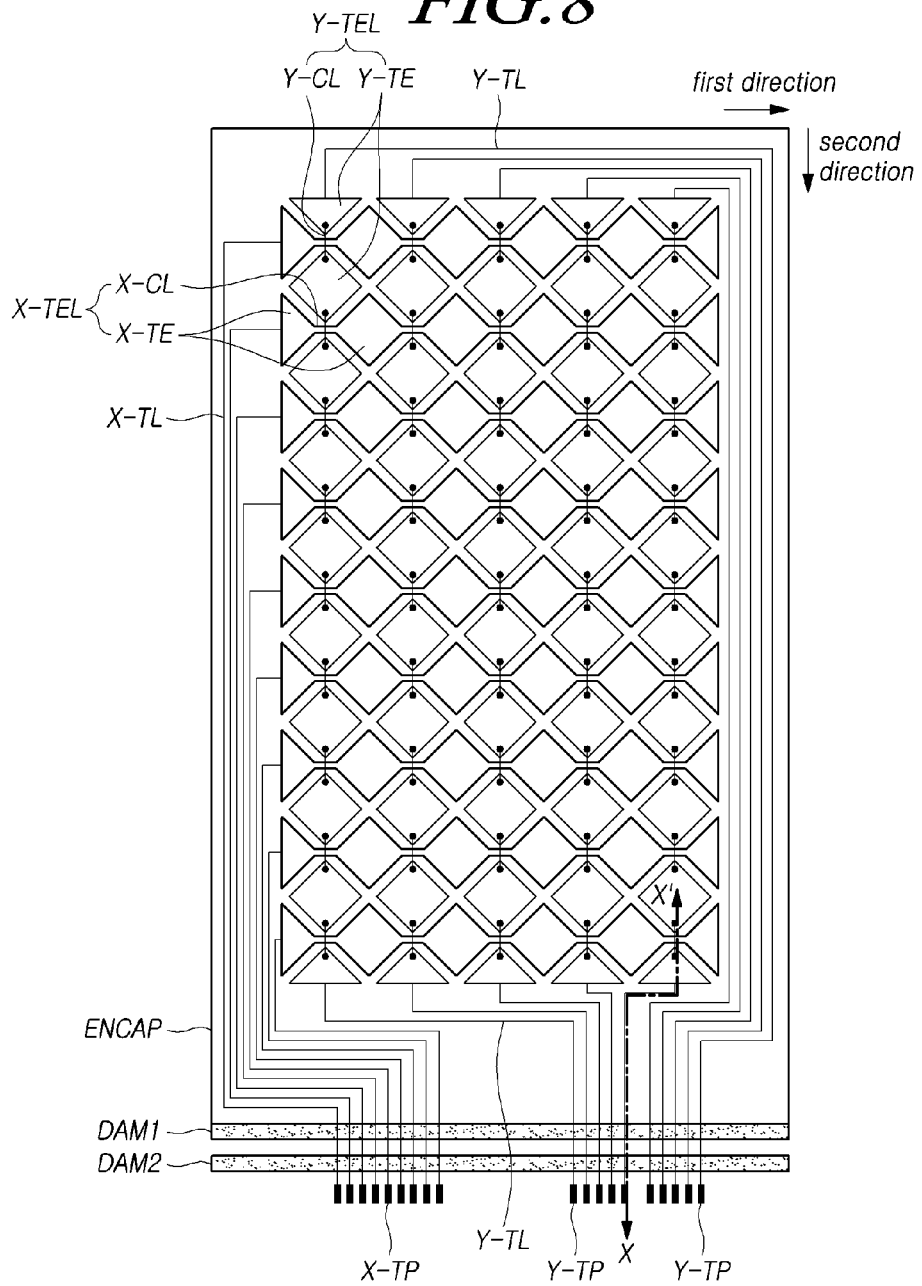
FIG. 8 is a view illustrating an example touch sensor structure as shown in FIG. 7 according to an embodiment.

FIG. 7 is a view schematically illustrating a touch sensor structure in a display panel DISP according to an embodiment. FIG. 8 is a view illustrating an example touch sensor structure as shown in FIG. 7.

Referring to FIG. 7, a touch sensor structure for mutual-capacitance-based touch sensing may include a plurality of X-touch electrode lines X-TEL and a plurality of Y-touch electrode lines Y-TEL. The plurality of X-touch electrode lines X-TEL and the plurality of Y-touch electrode lines Y-TEL are positioned on the encapsulation part ENCAP.

Each of the plurality of X-touch electrode lines X-TEL may be disposed in a first direction, and each of the plurality of Y-touch electrode lines Y-TEL may be disposed in a second direction different from the first direction.

In the disclosure, the first direction and the second direction may be relatively different directions. As an example, the first direction may be the x-axis direction, and the second direction may be the y-axis direction. In contrast, the first direction may be the y-axis direction, and the second direction may be the x-axis direction. The first direction and the second direction may be, or may not be, perpendicular to each other. In the disclosure, row and column are relative terms, and from a point of view, the terms "row" and "column" may be interchangeably used.

Each of the X-touch electrode lines X-TEL may be constituted of a plurality of X-touch electrodes X-TE electrically connected with each other. Each of the Y-touch electrode lines Y-TEL may be constituted of a plurality of Y-touch electrodes Y-TE electrically connected with each other.

The plurality of X-touch electrodes X-TE and the plurality of Y-touch electrodes Y-TE are electrodes which are included in the plurality of touch electrodes TE and have separate roles (functions) from each other.

For example, the plurality of X-touch electrodes X-TE constituting each of the plurality of X-touch electrode lines X-TEL may be driving touch electrodes, and the plurality of Y-touch electrodes Y-TE constituting each of the plurality of Y-touch electrode lines Y-TEL may be sensing touch electrodes. In this case, each of the plurality of X-touch electrode lines X-TEL corresponds to the driving touch electrode line, and each of the plurality of Y-touch electrode lines Y-TEL corresponds to the sensing touch electrode line.

In contrast, the plurality of X-touch electrodes X-TE constituting each of the plurality of X-touch electrode lines X-TEL may be sensing touch electrodes, and the plurality of Y-touch electrodes Y-TE constituting each of the plurality of Y-touch electrode lines Y-TEL may be driving touch electrodes. In this case, each of the plurality of X-touch electrode lines X-TEL corresponds to the sensing touch electrode line, and each of the plurality of Y-touch electrode lines Y-TEL corresponds to the driving touch electrode line.

A touch sensor metal for touch sensing may include a plurality of touch routing lines TL as well as the plurality of X-touch electrode lines X-TEL and the plurality of Y-touch electrode lines Y-TEL.

The plurality of touch routing lines TL may include one or more X-touch routing lines X-TL connected with each of the plurality of X-touch electrode lines X-TEL and one or more Y-touch routing lines Y-TL connected with each of the plurality of Y-touch electrode lines Y-TEL.

Referring to FIG. 8, each of the plurality of X-touch electrode lines X-TEL may include a plurality of X-touch electrodes X-TE arranged in the same row (or column) and one or more X-touch electrode connection lines X-CL electrically connecting the same. The X-touch electrode connection line X-CL connecting two adjacent X-touch electrodes X-TE may be a metal integrated with two adjacent X-touch electrodes X-TE (the example of FIG. 8) or be a metal connected with two adjacent X-touch electrodes X-TE via a contact hole.

Each of the plurality of Y-touch electrode lines Y-TEL may include a plurality of Y-touch electrodes Y-TE arranged in the same column (or row) and one or more Y-touch electrode connection lines Y-CL electrically connecting the same. The Y-touch electrode connection line Y-CL connecting two adjacent Y-touch electrodes Y-TE may be a metal integrated with two adjacent Y-touch electrodes Y-TE or be a metal connected with two adjacent Y-touch electrodes Y-TE via a contact hole (the example of FIG. 8).

In the crossing area (touch electrode line crossing area) of the X-touch electrode line X-TEL and the Y-touch electrode line Y-TEL, the X-touch electrode connection line X-CL and the Y-touch electrode connection line Y-CL may cross each other.

In this case, in the crossing area (touch electrode line crossing area) of the X-touch electrode line X-TEL and the Y-touch electrode line Y-TEL, the X-touch electrode connection line X-CL and the Y-touch electrode connection line Y-CL may cross each other.

As such, where the X-touch electrode connection line X-CL and the Y-touch electrode connection line Y-CL cross each other in the touch electrode line crossing area, the X-touch electrode connection line X-CL and the Y-touch electrode connection line Y-CL may be needed to be placed on different layers.

Thus, to cross the plurality of X-touch electrode lines X-TEL and the plurality of Y-touch electrode lines Y-TEL, the plurality of X-touch electrodes X-TE, the plurality of X-touch electrode connection lines X-CL, the plurality of Y-touch electrodes Y-TE, the plurality of Y-touch electrode lines Y-TEL, and the plurality of Y-touch electrode connection lines Y-CL may be positioned on two or more layers.

Referring to FIG. 8, each of the plurality of X-touch electrode lines X-TEL is electrically connected with the corresponding X-touch pad X-TP via one or more X-touch routing lines X-TL. In other words, the outermost X-touch electrode X-TE among the plurality of X-touch electrodes X-TE included in one X-touch electrode line X-TEL is electrically connected with the X-touch pad X-TP via the X-touch routing line X-TL.

Each of the plurality of Y-touch electrode lines Y-TEL is electrically connected with the corresponding Y-touch pad Y-TP via one or more Y-touch routing lines Y-TL. In other words, the outermost Y-touch electrode Y-TE among the plurality of Y-touch electrodes Y-TE included in one Y-touch electrode line Y-TEL is electrically connected with the Y-touch pad Y-TP via the Y-touch routing line Y-TL.

As shown in FIG. 8, the plurality of X-touch electrode lines X-TEL and the plurality of Y-touch electrode lines Y-TEL may be disposed on the encapsulation part ENCAP. In other words, the plurality of X-touch electrode connection lines X-CL and the plurality of X-touch electrodes X-TE constituting the plurality of X-touch electrode lines X-TEL may be disposed on the encapsulation part ENCAP. The plurality of Y-touch electrode connection lines Y-CL and the plurality of Y-touch electrodes Y-TE constituting the plurality of Y-touch electrode lines Y-TEL may be disposed on the encapsulation part ENCAP.

As shown in FIG. 8, each of the plurality of X-touch routing lines X-TL electrically connected with the plurality of X-touch electrode lines X-TEL may be disposed on the encapsulation part ENCAP and extend up to where the encapsulation part ENCAP is absent, and be electrically connected with the plurality of X-touch pads X-TP. Each of the plurality of Y-touch routing lines Y-TL electrically connected with the plurality of Y-touch electrode lines Y-TEL may be disposed on the encapsulation part ENCAP and extend up to where the encapsulation part ENCAP is absent, and be electrically connected with the plurality of Y-touch pads Y-TP. The encapsulation part ENCAP may be positioned in the active area AA and, in some cases, extend up to the non-active area NA.

As described above, to reduce collapsing of any layer (e.g., the encapsulation part in the OLED panel) in the active area AA, the dam area DA may be present in the border area between the active area AA and the non-active area NA or in the non-active area NA which is positioned around the active area AA.

As shown in FIG. 8, a primary dam DAM1 and a secondary dam DAM2 may be disposed in the dam area DA, as an example. The secondary dam DAM2 may be positioned further outside the primary dam DAM1.

Unlike in the example shown in FIG. 8, only the primary dam DAM1 may be positioned in the dam area DA or, in some cases, one or more dams may be disposed in addition to the primary dam DAM1 and the secondary dam DAM2.

Referring to FIG. 8, the encapsulation part ENCAP may be positioned on a side of the primary dam DAM1 or be positioned on the top as well as on a side of the primary dam DAM1.

Figure 9:
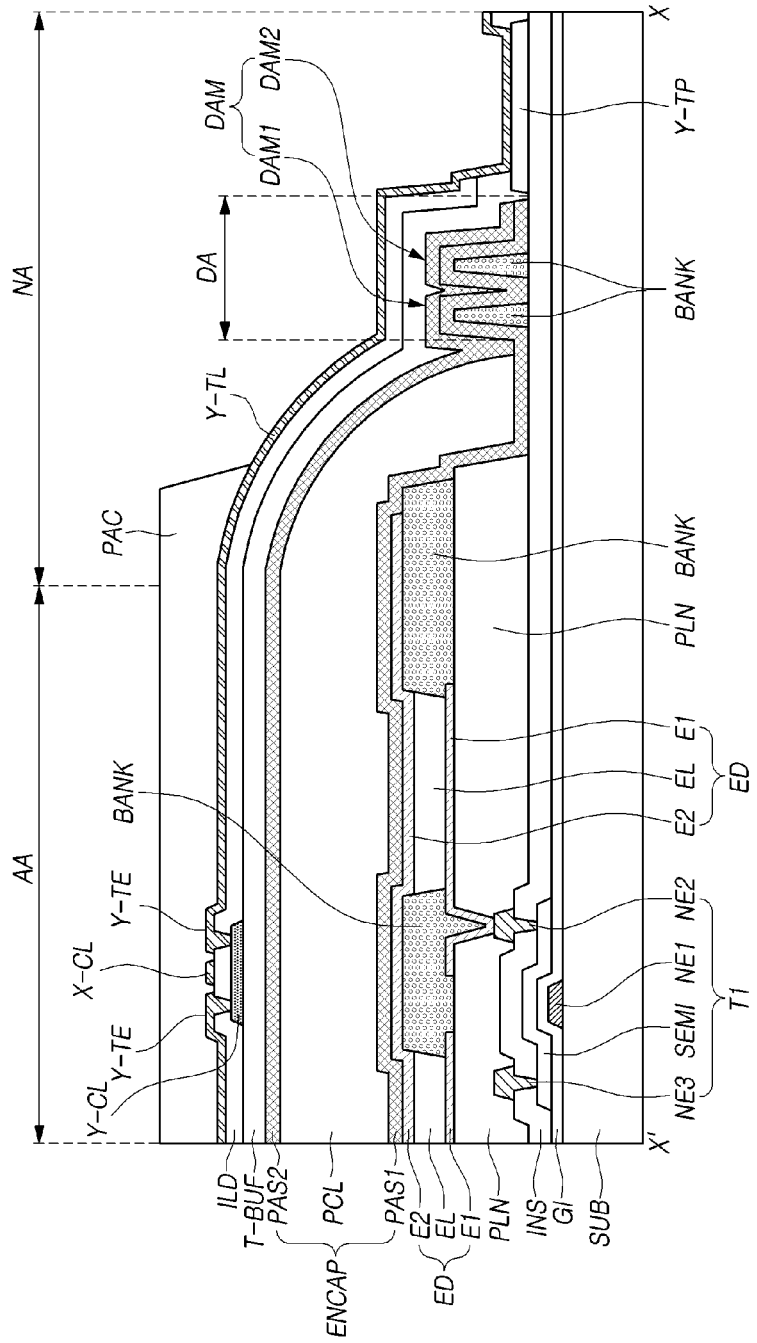
FIG. 9 is a partial cross-sectional view illustrating a display panel, taken along line X-X' of FIG. 8, according to an embodiment.

FIG. 9 is a partial cross-sectional view illustrating a display panel DISP, taken along line X-X' of FIG. 8, according to an embodiment. FIG. 9 illustrates a plate-shaped touch electrode TE, but this is merely an example. For example, a mesh-type touch electrode TE may be used. Where the touch electrode TE comes in a mesh type, the opening OA of the touch electrode TE may be positioned on the light emitting area of the subpixel SP.

In each subpixel SP in the active area AA, the first transistor T1, which is the driving transistor, is disposed on the substrate SUB.

The first transistor T1 includes a first node electrode NE1, which corresponds to the gate electrode, a second node electrode NE2, which corresponds to the source electrode or drain electrode, a third node electrode NE3, which corresponds to the drain electrode or source electrode, and a semiconductor layer SEMI.

The first node electrode NE1 and the semiconductor layer SEMI may overlap each other, with a gate insulation film GI disposed therebetween. The second node electrode NE2 may be formed on an insulation layer INS to contact one side of the semiconductor layer SEMI, and the third node electrode NE3 may be formed on the insulation layer INS to contact the other side of the semiconductor layer SEMI.

The light emitting element ED may include a first electrode E1, which corresponds to the anode electrode (or cathode electrode), a light emitting layer EL formed on the first electrode E1, and a second electrode E2 formed on the light emitting layer EL and corresponding to the cathode electrode (or anode electrode).

The first electrode E1 is electrically connected with the second node electrode NE2 of the first transistor T1, exposed through a pixel contact hole which passes through a planarization layer PLN.

The light emitting layer EL is formed on the first electrode E1 in a light emitting area prepared by a bank BANK. The light emitting layer EL is formed in the order of hole-related layer, light emitting layer, and electron-related layer, or its reverse order, on the first electrode E1. The second electrode E2 is formed to face the first electrode E1, with the light emitting layer EL disposed therebetween.

The encapsulation part ENCAP blocks penetration of external moisture or oxygen into the light emitting element ED which is vulnerable to external moisture or oxygen.

The encapsulation part ENCAP may be a single layer or may include a plurality of layers PAS1, PCL, and PAS2 as shown in FIG. 9.

For example, where the encapsulation part ENCAP is formed of multiple layers PAS1, PCL, and PAS2, the encapsulation part ENCAP may include one or more inorganic encapsulation layers PAS1 and PAS2 and one or more organic encapsulation layer PCL. As a specific example, the encapsulation part ENCAP may have a structure in which a first inorganic encapsulation layer PAS1, the organic encapsulation layer PCL, and the second inorganic encapsulation layer PAS2 are stacked in the order thereof.

The organic encapsulation layer PCL may further include at least one organic encapsulation layer or at least one inorganic encapsulation layer.

The first inorganic encapsulation layer PAS1 is formed on the substrate SUB where the second electrode E2 corresponding to the cathode electrode is formed, to be positioned most adjacent to the light emitting element ED. The first inorganic encapsulation layer PAS1 is formed of an inorganic insulation material capable of low-temperature deposition, such as, e.g., silicon nitride (SiNx), silicon oxide (SiOx), silicon oxynitride (SiON), or aluminum oxide ($Al_2O_3$). Since the first inorganic encapsulation layer PAS1 is deposed at low-temperature atmosphere, the first inorganic encapsulation layer PAS1 may reduce damage to the light emitting layer EL including the organic material vulnerable to high-temperature atmosphere upon deposition.

The organic encapsulation layer PCL may be formed in a smaller area than the first inorganic encapsulation layer PAS1 in which case the organic encapsulation layer PCL may be formed to expose both end tips of the first inorganic encapsulation layer PAS1. The organic encapsulation layer PCL serves to mitigate stress between the layers due to a warping of the touch display device which is an OLED device, while reinforcing the planarization performance. The organic encapsulation layer PCL may be formed of, e.g., an acrylic resin, epoxy resin, polyimide, polyethylene, silicon oxycarbonate (SiOC), or other organic insulation materials.

Where the organic encapsulation layer PCL is formed in an inkjet method, one or two dams DAM may be formed in the border area between the non-active area NA and the active area AA or the dam area DA which is a portion of the non-active area NA.

For example, as shown in FIG. 9, the dam area DA may be positioned between the active area AA and the pad area, where the plurality of X-touch pads X-TP and the plurality of Y-touch pads Y-TP are formed in the non-active area NA and, in the dam area DA, a primary dam DAM1 adjacent to the active area AA and a secondary dam DAM2 adjacent to the pad area may be present.

The one or more dams DAM disposed in the dam area DA may reduce the liquid-state organic encapsulation layer PCL from collapsing to the non-active area NA and resultantly penetrating into the pad area when the liquid-phase organic encapsulation layer PCL is dropped to the active area AA.

This effect may be increased when the primary dam DAM1 and the secondary dam DAM2 are provided as shown in FIG. 9.

The primary dam DAM1 and/or the secondary dam DAM2 may be formed in a single-layer structure or multilayer structure. For example, the primary dam DAM1 and/or the secondary dam DAM2 may simultaneously be formed of the same material as at least one of the bank BANK and a spacer (not shown). In this case, a dam structure may be formed without a masking process or cost rise.

The primary dam DAM1 and/or the secondary dam DAM2 may be structured so that the first inorganic encapsulation layer PAS1 and/or the second inorganic encapsulation layer PAS2 are stacked on the bank BANK as shown in FIG. 9.

The organic encapsulation layer PCL including an organic material may be positioned only on an inside surface of the primary dam DAM1 as shown in FIG. 9.

Unlike this, the organic encapsulation layer PCL containing an organic material may also be positioned on the top of at least a portion of the primary dam DAM1 and the secondary dam DAM2. As an example, the organic encapsulation layer PCL may also be positioned on the top of the primary dam DAM1.

The second inorganic encapsulation layer PAS2 may be formed to cover the respective top surfaces and side surfaces of the organic encapsulation layer PCL and the first inorganic encapsulation layer PAS1, on the substrate SUB where the organic encapsulation layer PCL is formed. The second inorganic encapsulation layer PAS2 reduces or blocks penetration of external moisture or oxygen into the first inorganic encapsulation layer PAS1 and the organic encapsulation layer PCL. The second inorganic encapsulation layer PAS2 is formed of an inorganic insulation material, such as, e.g., silicon nitride (SiNx), silicon oxide (SiOx), silicon oxynitride (SiON), or aluminum oxide ($Al_2O_3$).

A touch buffer film T-BUF may be disposed on the encapsulation part ENCAP. The touch buffer film T-BUF may be positioned between the second electrode E2 of the light emitting element ED and the touch sensor metal including the X-touch electrodes X-TE, the Y-touch electrodes Y-TE, the X-touch electrode connection lines X-CL, and the Y-touch electrode connection lines Y-CL.

The touch buffer film T-BUF may be designed to maintain a predetermined minimum spacing (e.g., 1 μm) between the touch sensor metal and the second electrode E2 of the light emitting element ED. Thus, it is possible to reduce or prevent the parasitic capacitance formed between the touch sensor metal and the second electrode E2 of the light emitting element ED and hence r deterioration of touch sensitivity due to parasitic capacitance.

It is also possible to place the touch sensor metal including the X-touch electrodes X-TE, the Y-touch electrodes Y-TE, the X-touch electrode connection lines X-CL, and the Y-touch electrode connection lines Y-CL, on the encapsulation part ENCAP, without the touch buffer film T-BUF.

The touch buffer film T-BUF may block off penetration, into the organic material-containing light emitting layer EL, of external moisture or the chemical (e.g., developer or etchant) used upon manufacturing the touch sensor metal disposed on the touch buffer film T-BUF. Thus, the touch buffer film T-BUF may reduce damage to the light emitting layer EL vulnerable to chemicals or moisture.

The touch buffer film T-BUF is formed of an organic insulation material with a low permittivity of 1 to 3 and formed at a low temperature which is not more than a predetermined temperature (e.g., 100° C.) to reduce damage to the light emitting layer EL containing the organic material vulnerable to high temperature. For example, the touch buffer film T-BUF may be formed of an acrylic-based, epoxy-based, or siloxane-based material. The touch buffer film T-BUF with planarization characteristics, formed of an organic insulation material, may reduce a fracture of the touch sensor metal formed on the touch buffer film T-BUF and damage to the encapsulation layers PAS1, PCL, and PAS2 constituting the encapsulation part ENCAP due to a warping of the OLED device.

According to a mutual-capacitance-based touch sensor structure, the X-touch electrode line X-TEL and the Y-touch electrode line Y-TEL may be formed on the touch buffer film T-BUF, and the X-touch electrode line X-TEL and the Y-touch electrode line Y-TEL may be disposed to cross each other.

The Y-touch electrode line Y-TEL may include the plurality of Y-touch electrodes Y-TE and the plurality of Y-touch electrode connection lines Y-CL electrically connecting the plurality of Y-touch electrodes Y-TE.

As shown in FIG. 9, the plurality of Y-touch electrodes Y-TE and the plurality of Y-touch electrode connection lines Y-CL may be positioned on different layers, with a touch insulation film ILD disposed therebetween.

The plurality of Y-touch electrodes Y-TE may be spaced apart at a predetermined interval along the y axis direction. Each of the plurality of Y-touch electrodes Y-TE may be electrically connected with another Y-touch electrode Y-TE adjacent thereto in the y axis direction via the Y-touch electrode connection line Y-CL.

The Y-touch electrode connection line Y-CL may be formed on the touch buffer film T-BUF and be exposed via the touch contact hole passing through the touch insulation film ILD and be electrically connected with two Y-touch electrodes Y-TE adjacent in the y axis direction.

The Y-touch electrode connection line Y-CL may be disposed to overlap the bank BANK. Thus, it is possible to reduce a reduction in the aperture ratio due to the Y-touch electrode connection line Y-CL.

The X-touch electrode line X-TEL may include the plurality of X-touch electrodes X-TE and the plurality of X-touch electrode connection lines X-CL electrically connecting the plurality of X-touch electrodes X-TE. The plurality of X-touch electrodes X-TE and the plurality of X-touch electrode connection lines X-CL may be positioned on different layers, with a touch insulation film ILD disposed therebetween.

The plurality of X-touch electrodes X-TE may be spaced apart at a predetermined interval along the x axis direction. Each of the plurality of X-touch electrodes X-TE may be electrically connected with another X-touch electrode X-TE adjacent thereto in the x axis direction via the X-touch electrode connection line X-CL.

The X-touch electrode connection line X-CL may be disposed on the same plane as the X-touch electrode X-TE and be electrically connected with two X-touch electrodes X-TE adjacent thereto in the x axis direction without a separate contact hole or be integrated with the two X-touch electrodes X-TE adjacent thereto each other in the x axis direction.

The X-touch electrode connection line X-CL may be disposed to overlap the bank BANK. Thus, it is possible to reduce a reduction in the aperture ratio due to the X-touch electrode connection line X-CL.

The Y-touch electrode line Y-TEL may be electrically connected with the touch driving circuit TDC via the Y-touch routing line Y-TL and the Y-touch pad Y-TP. Likewise, the X-touch electrode line X-TEL may be electrically connected with the touch driving circuit TDC via the X-touch routing line X-TL and the X-touch pad X-TP.

A pad cover electrode may be further provided to cover the X-touch pad X-TP and the Y-touch pad Y-TP.

The X-touch pad X-TP may be formed separately from the X-touch routing line X-TL or may extend from the X-touch routing line X-TL. The Y-touch pad Y-TP may be formed separately from the Y-touch routing line Y-TL or may extend from the Y-touch routing line Y-TL.

Where the X-touch pad X-TP extends from the X-touch routing line X-TL, and the Y-touch pad Y-TP extends from the Y-touch routing line Y-TL, the X-touch pad X-TP, the X-touch routing line X-TL, the Y-touch pad Y-TP, and the Y-touch routing line Y-TL may be formed of the same first conductive material. The first conductive material may be formed in a single-layer or multi-layer structure using a metal with good corrosion or acid resistance or electric conductivity, such as Al, T1, Cu, or Mo.

For example, the X-touch pad X-TP, X-touch routing line X-TL, Y-touch pad Y-TP, and Y-touch routing line Y-TL formed of the first conductive material may be formed in a three-layer stacked structure, such as Ti/Al/Ti or Mo/Al/Mo.

The pad cover electrode capable of covering the X-touch pad X-TP and Y-touch pad Y-TP may be formed of a second conductive material which is the same material as the X-touch electrode and Y-touch electrode X-TE and Y-TE. The second conductive material may be formed of a transparent conductive material, such as ITO or IZO, which has high corrosion or acid resistance. The pad cover electrode may be formed to be exposed by the touch buffer film T-BUF and be thus bonded with the touch driving circuit TDC or a circuit film where the touch driving circuit TDC is mounted.

The touch buffer film T-BUF may be formed to cover the touch sensor metal, reducing corrosion to the touch sensor metal by external moisture. As an example, the touch buffer film T-BUF may be formed of an organic insulation material or as a circular polarizer or epoxy or acrylic film. The touch buffer film T-BUF on the encapsulation part ENCAP may be omitted. In other words, the touch buffer film T-BUF may not be an essential component.

The Y-touch routing line Y-TL may be electrically connected with the Y-touch electrode via the touch routing line contact hole or be integrated with the Y-touch electrode Y-TE.

The Y-touch routing line Y-TL may extend up to the non-active area NA and be electrically connected with the Y-touch pad Y-TP via the top and side of the encapsulation part ENCAP and the top and side of the dam DAM. Thus, the Y-touch routing line Y-TL may be electrically connected with the touch driving circuit TDC via the Y-touch pad Y-TP.

The Y-touch routing line Y-TL may transfer the touch sensing signal from the Y-touch electrode Y-TE to the touch driving circuit TDC or may receive the touch driving signal from the touch driving circuit TDC and transfer the touch driving signal to the Y-touch electrode Y-TE.

The X-touch routing line X-TL may be electrically connected with the X-touch electrode X-TE via the touch routing line contact hole or may be integrated with the X-touch electrode X-TE.

The X-touch routing line X-TL may extend up to the non-active area NA and be electrically connected with the X-touch pad X-TP via the top and side of the encapsulation part ENCAP and the top and side of the dam DAM. Thus, the X-touch routing line X-TL may be electrically connected with the touch driving circuit TDC via the X-touch pad X-TP.

The X-touch routing line X-TL may receive the touch driving signal form the touch driving circuit TDC and transfer the touch driving signal to the X-touch electrode X-TE and may transfer the touch sensing signal from the X-touch electrode X-TE to the touch driving circuit TDC.

The arrangement of the X-touch routing line X-TL and the Y-touch routing line Y-TL may be varied depending on panel design specifications.

A touch protection film PAC may be disposed on the X-touch electrode X-TE and the Y-touch electrode Y-TE. The touch protection film PAC may extend up to before or after the dam DAM and may thus be disposed even on the X-touch routing line X-TL and the Y-touch routing line Y-TL.

The cross-sectional view of FIG. 9 illustrates a conceptual structure. Depending on the direction or position in which it is viewed, the position, thickness, or width of each pattern (e.g., various layers or electrodes) may be varied, and the connection structure of various patterns may be varied, and an additional layer other than the layers shown may be present as well, or some of the layers may be omitted or combined. For example, the width of the bank BANK may be narrower than that shown in the drawings, and the height of the dam DAM may be higher or lower than that shown.

In FIG. 9, the touch electrode TE or touch routing line TL is overall disposed on the subpixel SP to represent an example structure of being connected to the touch pad TP along the inclined surface of the encapsulation part ENCAP and the touch routing line TL. However, if the touch electrode TE is formed in the above-described mesh type, the opening OA of the touch electrode TE may be positioned on the light emitting area of the subpixel SP. A color filter CF may be disposed on the encapsulation part ENCAP. The color filter CF may be positioned on the touch electrode TE or between the encapsulation part ENCAP and the touch electrode TE.

Figure 10:
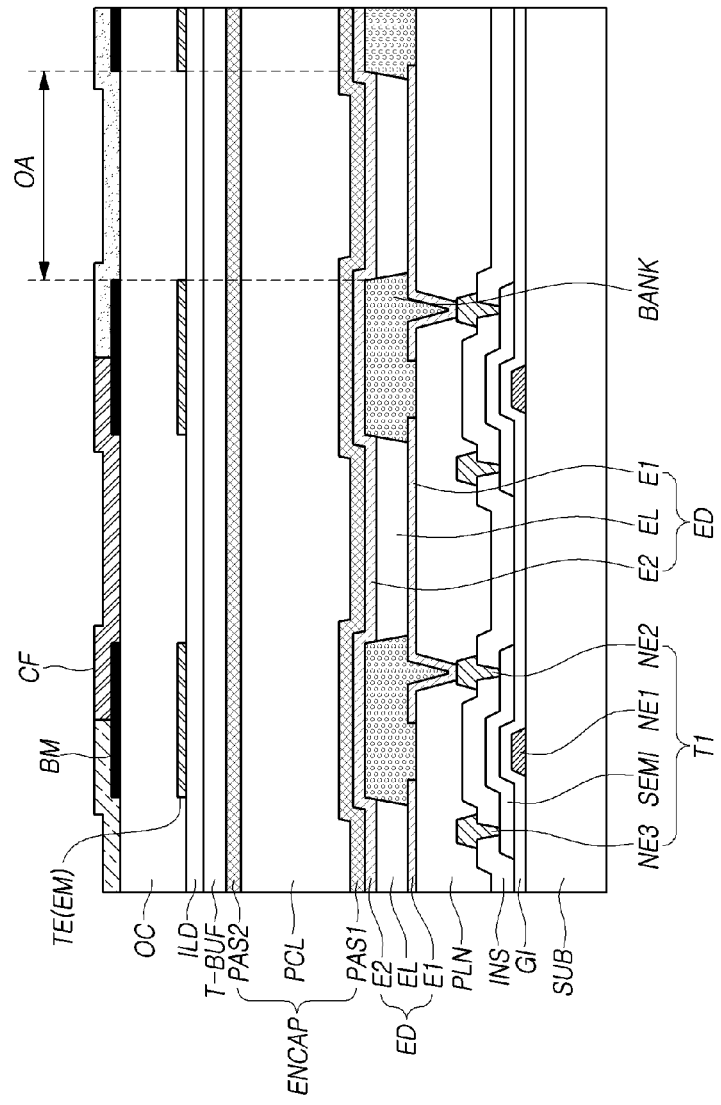
FIGS. 10 and 11 are cross-sectional views illustrating a structure in which a color filter is included in a display panel according to an embodiment.
Figure 11:
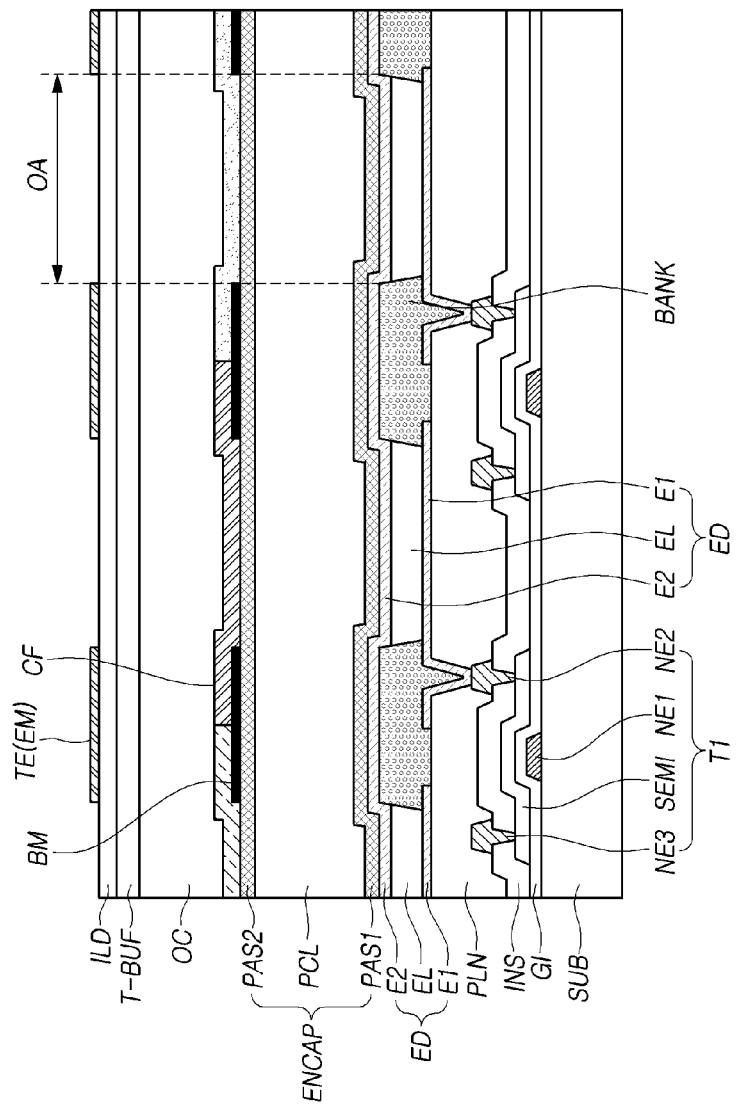

FIGS. 10 and 11 are cross-sectional views illustrating a structure in which a color filter CF is included in a display panel DISP according to an embodiment.

Referring to FIGS. 10 and 11, where the touch panel TSP is embedded in the display panel DISP, and the display panel DISP is implemented as an OLED panel, the touch panel TSP may be positioned on the encapsulation part ENCAP in the display panel DISP. In other words, the touch sensor metal, such as multiple touch routing lines TL or multiple touch electrodes TE, may be positioned on the encapsulation part ENCAP in the display panel DISP.

As described above, as the touch electrode TE is formed on the encapsulation part ENCAP, the touch electrode may be formed without significantly affecting the formation of display-related layers and the performance of display.

Referring to FIGS. 10 and 11, the second electrode E2, which may be the cathode electrode of the OLED, may be positioned under the encapsulation part ENCAP.

The thickness T of the encapsulation part ENCAP may be, e.g., 1 μm or more.

As described above, as the thickness of the encapsulation part ENCAP is designed to be 1 μm or more, the parasitic capacitance formed between the touch electrodes TE and the second electrode E2 of the OLED may be reduced. Thus, deterioration of touch sensitivity due to parasitic capacitance may be reduced.

As set forth above, each of the plurality of touch electrodes TE may have the electrode metal EM patterned in a mesh type with two or more openings OA, and each of the two or more openings OA may correspond to one or more subpixels or its light emission area as viewed in the vertical direction.

As described above, the electrode metal EM may be patterned so that the light emitting area of one or more subpixels is present corresponding to the position of each of two or more openings OA present in the area of the touch electrode TE as viewed at plan view. Thus, the light emitting efficiency of the display panel DISP may be increased.

As shown in FIGS. 10 and 11, a black matrix BM may be disposed on the display panel DISP, and a color filter CF may further be disposed.

The position of the black matrix BM may correspond to the position of the electrode metal EM of the touch electrode TE.

The position of multiple color filters CF corresponds to the position of multiple touch electrodes TE or the electrode metal EM constituting multiple touch electrodes TE.

As described above, as multiple color filters CF are placed in the position corresponding to the position of multiple openings OA, the light emitting performance of the display panel DISP may be increased.

The vertical position relationship between multiple color filters CF and multiple touch electrodes TE is described below.

As shown in FIG. 10, multiple color filters CF and a black matrix BM may be positioned on multiple touch electrodes TE.

In this case, the multiple color filters CF and the black matrix BM may be positioned on an overcoat layer OC disposed on the multiple touch electrodes TE. The overcoat layer OC may be a layer which is identical to or different from the touch protection film PAC of FIG. 9.

As shown in FIG. 11, the multiple color filters CF and the black matrix BM may be positioned under the multiple touch electrodes TE.

In this case, the multiple touch electrodes TE may be positioned over the overcoat layer OC on the multiple color filters CF and the black matrix BM. The overcoat layer OC may be a layer which is identical to or different from the touch buffer film T-BUF or touch insulation film ILD of FIG. 9. Alternatively, the touch buffer film T-BUF or touch insulation film ILD may be disposed separately from the overcoat layer OC.

As such, it is possible to place the configuration for touch sensing without deteriorating display performance by adjusting the vertical position relationship between the touch electrode TE and the configuration for display driving.

As the touch electrodes TE and lines are placed on the electrodes and lines for display driving, the configuration for display driving may influence the touch sensing performance.

According to an embodiment, there are provided a method for reducing deterioration of touch sensing performance due to the configuration for display driving and a method for placing the configuration for touch sensing without deteriorating display performance.

Figure 12:
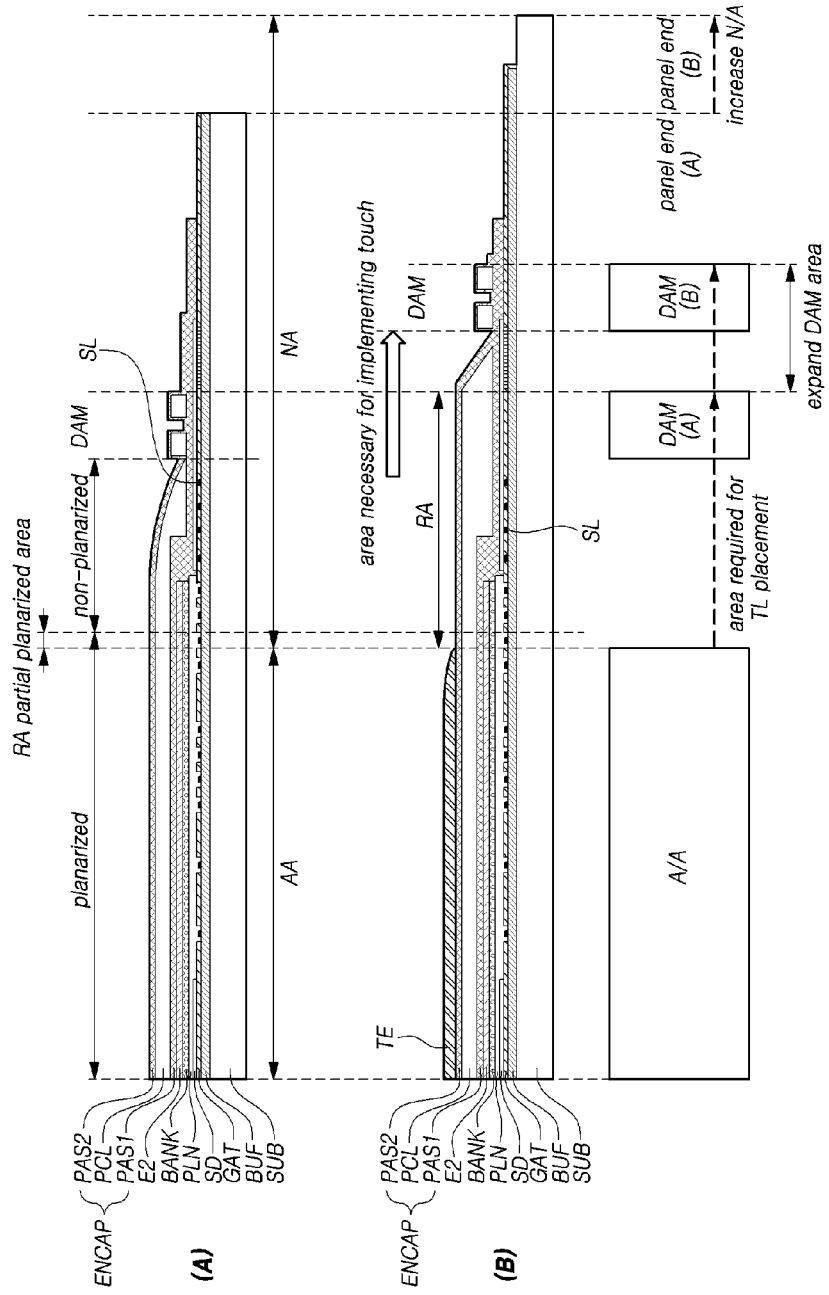
FIG. 12 including cross-sectional view part (A) and cross-sectional view part (B) illustrating a structure of a non-active area in which touch routing lines are arranged in a display panel according to an embodiment.

FIG. 12 is a cross-sectional view illustrating a structure of a non-active area NA in which touch routing lines TL are arranged on a display panel DISP according to an embodiment.

FIG. 12 part (A) illustrates a cross-sectional structure of the display panel DISP when no touch electrode TE is disposed, and FIG. 12 part (B) illustrates a cross-sectional structure of the display panel DISP when a touch electrode TE is disposed.

As shown in FIG. 12 part (A), various metals and light emitting element ED are disposed in the active area AA of the display panel DISP, and the encapsulation part ENCAP is disposed on the second electrode E2 of the light emitting element ED. The encapsulation part ENCAP disposed in the active area AA may be planarized.

A portion of the encapsulation part ENCAP disposed in the non-active area NA may be planarized, and the rest thereof may not be. In other words, the encapsulation part ENCAP disposed in the non-active area NA may include an inclined surface or an inclined area.

In this case, if the touch routing line TL is disposed in the non-planarized area of the encapsulation part ENCAP, the distance from the signal line SL positioned under the encapsulation part ENCAP may be reduced, thus increasing the parasitic capacitance between the touch routing line TL and the signal line SL. The signal line SL is a line to which signals for driving the display are applied and may be, e.g., a line to which the clock signal CLK is applied, but not limited thereto.

Thus, to reduce the parasitic capacitance between the touch routing line TL and the signal line SL, the routing area RA where the touch routing line TL is disposed needs to be a planarized area of the encapsulation part ENCAP. If the planarized area of the encapsulation part ENCAP as shown in FIG. 12 part (A) is very small, the touch routing line TL may be hard to place.

Hence, it is possible to increase the planarized area of the encapsulation part ENCAP in the non-active area NA to be able to place the touch routing line TL as shown in FIG. 12 part (B).

Since the planarized area of the encapsulation part ENCAP is increased in the non-active area NA, the routing area RA for placing the touch routing line TL may be increased. Thus, the touch routing line TL may be disposed in the non-active area NA, and the touch sensing function may be implemented in the display panel DISP.

However, the increase in the planarized area of the encapsulation part ENCAP in the non-active area NA may lead to an increase in the distance to where the dam DAM is disposed in the active area AA. As the position where the dam DAM is disposed becomes farther away from the active area AA, the distance between the active area AA and the end of the display panel DISP may be increased, so that the size of the non-active area NA of the display panel DISP may be increased.

Thus, to reduce the increase in the non-active area NA due to the placement of the touch routing line TL, part of the touch routing line TL may be disposed on the inclined surface, i.e., the non-planarized area, of the encapsulation part ENCAP in the non-active area NA.

According to an embodiment, there is provided a method for reducing the parasitic capacitance between the signal line SL and the touch routing line TL disposed in the non-planarized area of the encapsulation part ENCAP.

The touch routing line TL may be rendered to be placed in the non-planarized area of the encapsulation part ENCAP by reducing the noise of the touch routing line TL in the non-planarized area of the encapsulation part ENCAP. Thus, the increase in the non-active area NA may be reduced.

Figure 13:
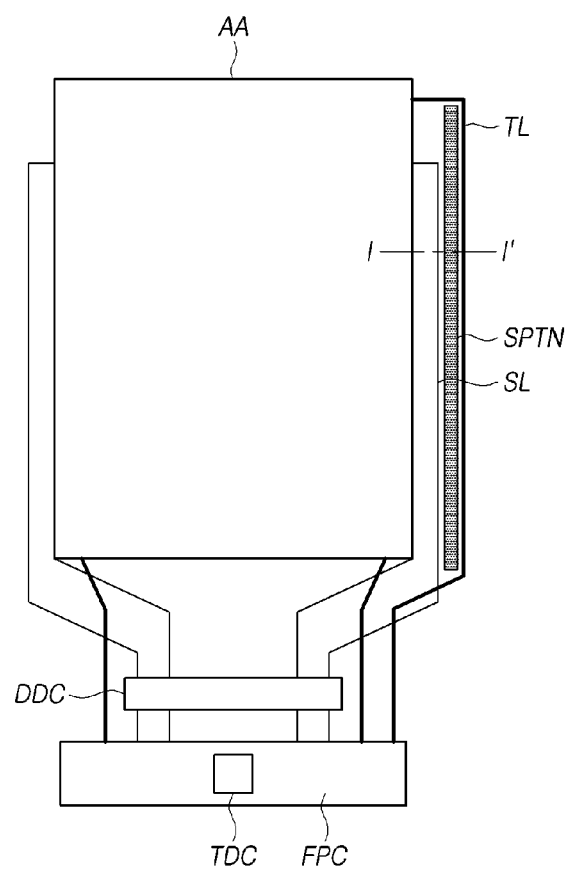
FIG. 13 is a plan view illustrating a structure in which a noise reduction configuration is disposed in a non-active area of a display panel according to an embodiment.
Figure 14:
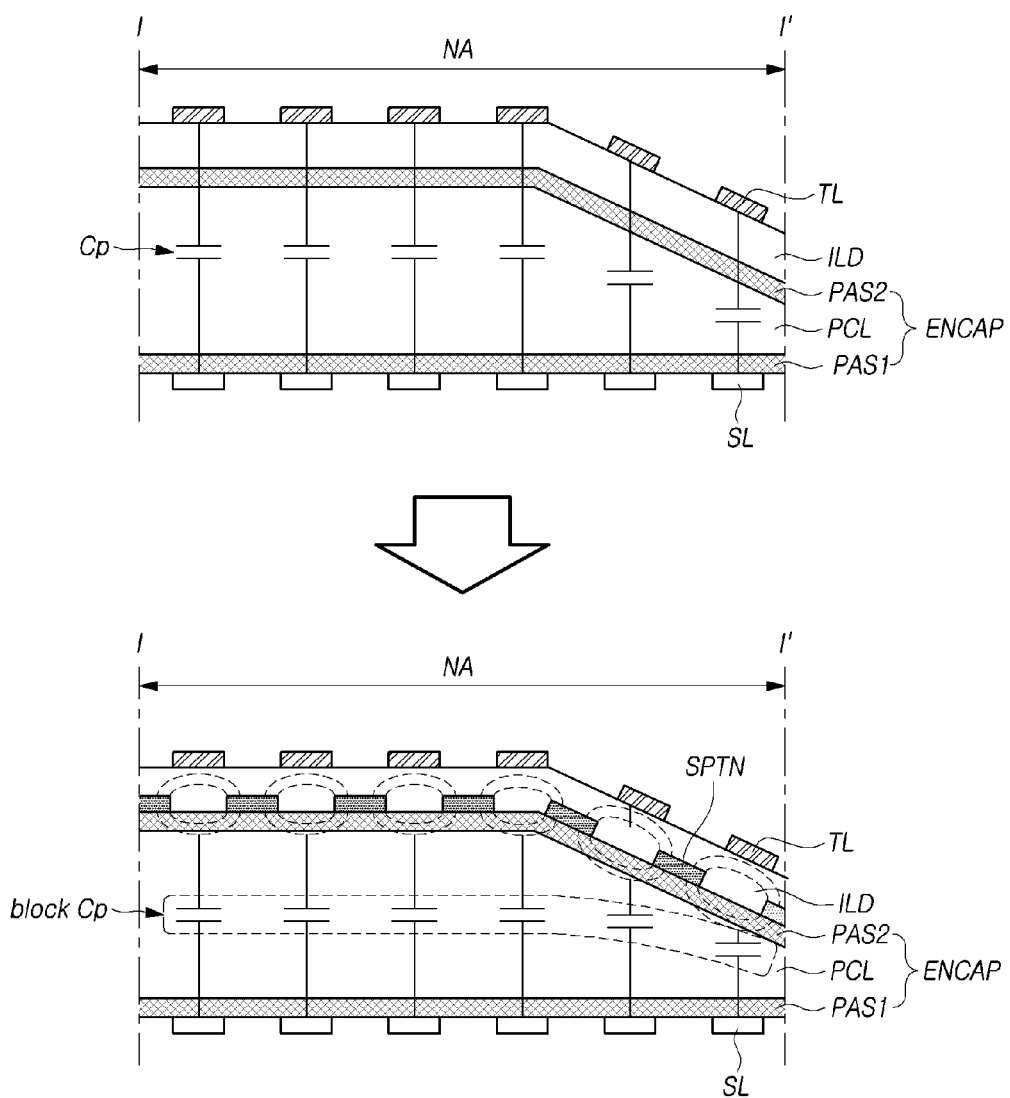
FIG. 14 is a cross-sectional view illustrating an example structure, taken along line I-I' of FIG. 13 according to an embodiment.

FIG. 13 is a plan view illustrating a structure in which a noise reduction configuration is disposed in a non-active area NA of a display panel DISP according to an embodiment. FIG. 14 is a cross-sectional view illustrating an example structure, taken along line I-I' of FIG. 13.

Referring to FIGS. 13 and 14, various signal lines SL may be disposed through which signals for display driving are applied to the non-active area NA of the display panel DISP providing the touch sensing function. The signal line SL may be disposed under, e.g., the encapsulation part ENCAP.

Multiple touch routing lines TL for applying touch driving signals or detecting touch sensing signals may be disposed in the non-active area NA of the display panel DISP. The touch routing line TL may be disposed on, e.g., the encapsulation part ENCAP.

For a thinner display panel DISP, the thickness of the encapsulation part ENCAP may be reduced. This results in the touch routing line TL and the signal line SL being closer to each other, thus increasing the parasitic capacitance Cp between the lines. Particularly in the non-planarized area of the encapsulation part ENCAP, the thickness of the encapsulation part ENCAP may be reduced. Thus, the distance between the touch routing line TL and the signal line SL may be further reduced, increasing the touch sensing signal noise due to the parasitic capacitance Cp.

An embodiment of the disclosure places a shielding pattern SPTN between the touch routing line TL and the signal line SL and enables an electric field to be generated by the shielding pattern SPTN, thereby reducing the parasitic capacitance between the touch routing line TL and the signal line SL.

Referring to FIG. 14, at least one shielding pattern SPTN may be disposed between the touch routing line TL and the encapsulation part ENCAP in the non-active area NA. The shielding pattern SPTN may be disposed in at least a portion of the planarized area and the non-planarized area of the encapsulation part ENCAP in the non-active area NA.

The shielding pattern SPTN may be disposed in an area except for the area overlapping the touch routing line TL. In other words, the shielding pattern SPTN may be disposed not to overlap the touch routing line TL.

The shielding pattern SPTN may, or may not, overlap the signal line SL. Only a portion of the shielding pattern SPTN may overlap the signal line SL.

The shielding pattern SPTN may receive a constant voltage, e.g., a ground voltage. Or, the shielding pattern SPTN may receive a predetermined level of constant voltage.

Since a constant voltage is applied to the shielding pattern SPTN, an electric field may be generated between the shielding pattern SPTN and its adjacent shielding pattern SPTN. The noise by the signal line SL may be prevented from affecting the touch routing line TL by the electric field generated between the shielding patterns SPTN.

The noise by the signal line SL positioned in the area between the shielding patterns SPTN may be blocked off by the electric field generated between the shielding patterns SPTN. The noise by the signal line SL positioned in the area overlapping the shielding pattern SPTN may be blocked by the shielding pattern SPTN.

Since the shielding pattern SPTN is disposed to overlap the touch routing line TL, no or little parasitic capacitance may be formed between the shielding pattern SPTN and the touch routing line TL. Thus, although the noise by the signal line SL is transferred to the shielding pattern SPTN, the noise by the shielding pattern SPTN may be blocked, so that the touch routing line TL may not be influenced.

As such, it is possible to reduce the touch sensing signal noise due to the signal line SL by placing the shielding pattern SPTN which forms an electric field without overlapping the touch routing line TL between the signal line SL and the touch routing line TL in the non-active area NA.

Thus, as the touch routing line TL may be placed in the non-planarized area of the encapsulation part ENCAP in the non-active area NA, it is possible to reduce the increase in the non-active area NA due to the placement of the touch routing line TL.

The shielding pattern SPTN may be positioned between the touch routing line TL and the signal line SL and, in some cases, the shielding pattern SPTN may be disposed on the encapsulation part ENCAP or under the encapsulation part ENCAP.

Where the shielding pattern SPTN is disposed on the encapsulation part ENCAP, the shielding pattern SPTN may be implemented easily without adding a separate process by using the same metal as the touch electrode connection line CL disposed on a different layer from the touch electrode TE for connection of the touch electrode TE in the active area AA.

In the planarized area of the encapsulation part ENCAP, which is relatively less influenced by the noise due to the signal line SL, the shielding pattern SPTN may not be formed or the configuration for shielding may be disposed on another layer.

In such a case, it is possible to reduce the resistance of the touch routing line TL by using the metal disposed on the same layer as the shielding pattern SPTN in the planarized area of the encapsulation part ENCAP, as the touch routing line TL.

Figure 15:
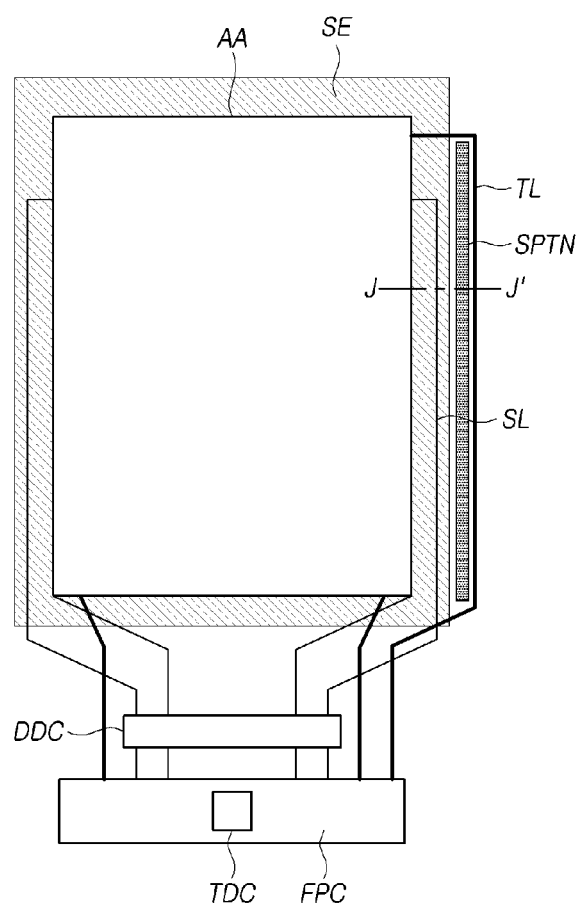
FIG. 15 is a plan view illustrating a structure in which a noise reduction configuration is disposed in a non-active area of a display panel according to an embodiment.
Figure 16:
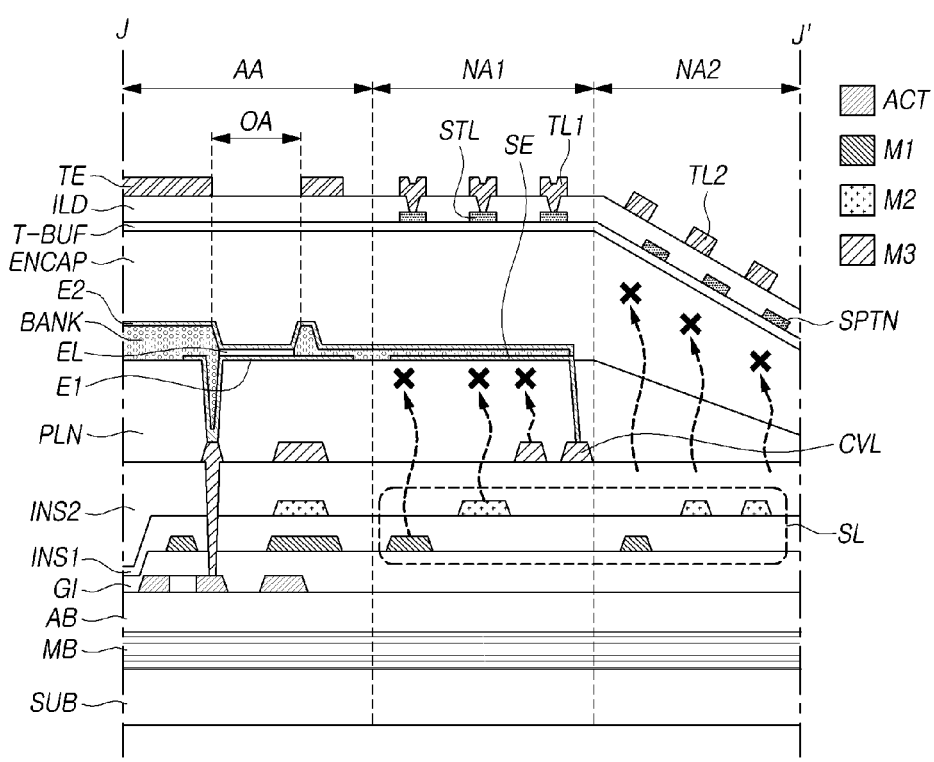
FIGS. 16 and 17 are cross-sectional view illustrating an example structure, taken along line J-J' of FIG. 15 according to an embodiment.
Figure 17:
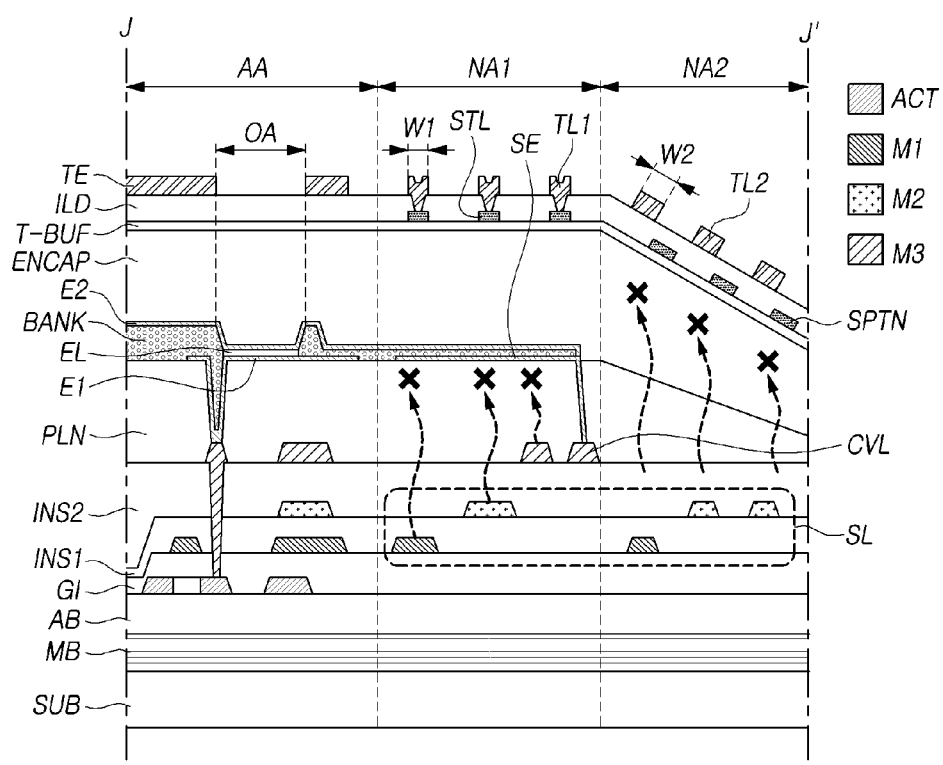

FIG. 15 is a plan view illustrating a structure in which a noise reduction configuration is disposed in a non-active area NA of a display panel DISP according to an embodiment. FIGS. 16 and 17 are cross-sectional view illustrating an example structure, taken along line J-J' of FIG. 15.

Referring to FIGS. 15 and 16, the non-active area NA of the display panel DISP may include a first non-active area NA1 which is the planarized area of the encapsulation part ENCAP and is positioned outside the active area AA.

The non-active area NA may include a second non-active area NA2 which is the non-planarized area of the encapsulation part ENCAP and is positioned outside the first non-active area NA1.

In the disclosure, the first non-active area NA1 and the second non-active area NA2 may also be referred to as a "first area" and a "second area," respectively. The touch routing line TL disposed in the first non-active area NA1 may be referred to as a first touch routing line TL1, and the touch routing line TL disposed in the second non-active area NA2 may be referred to as a second touch routing line TL2.

The second non-active area NA2 which is the non-planarized area of the encapsulation part ENCAP may have an inclined structure of the encapsulation part ENCAP. Thus, the thickness of the encapsulation part ENCAP may gradually reduce, and this area may be significantly influenced by the noise due to the signal line SL positioned under the encapsulation part ENCAP.

Hence, in the non-planarized area of the encapsulation part ENCAP, the shielding pattern SPTN may be disposed between the second touch routing line TL2 and the signal line SL, and the shielding pattern SPTN may be disposed, e.g., between the second touch routing line TL2 and the encapsulation part ENCAP.

The shielding pattern SPTN may be disposed not to overlap the second touch routing line TL2, and a constant voltage may be applied to the shielding pattern SPTN.

Thus, the noise due to the signal line SL may be blocked by the electric field generated by the shielding pattern SPTN. Further, since the shielding pattern SPTN does not overlap the second touch routing line TL2, it is possible to reduce noise due to parasitic capacitance which would otherwise occur between the shielding pattern SPTN and the second touch routing line TL2.

The first non-active area NA1 which is the planarized area of the encapsulation part ENCAP may be relatively less influenced by the noise due to the signal line SL positioned under the encapsulation part ENCAP, because the encapsulation part ENCAP has a constant thickness. Thus, the shielding pattern SPTN may not be disposed in the first non-active area NA1.

That is, the shielding pattern SPTN may be disposed in at least a portion of the non-active area NA and be disposed in an area including the second non-active area NA2 which is the non-planarized area of the encapsulation part ENCAP. Further, the shielding pattern SPTN may be disposed only in the area except for the first non-active area NA1 which is the planarized area of the encapsulation part ENCAP.

Where the shielding pattern SPTN is not disposed in the first non-active area NA1, the metal disposed on the same layer as the shielding pattern SPTN in the first non-active area NA1 may be connected with the first touch routing line TL1 and be used as an auxiliary routing line STL.

The auxiliary routing line STL may be disposed between the encapsulation part ENCAP and the first touch routing line TL1 to overlap the first touch routing line TL1 in the first non-active area NA1. The auxiliary routing line STL may be connected with the first touch routing line TL1 via a contact hole formed in the touch insulation film ILD, reducing the resistance of the first touch routing line TL1.

As such, as the metals disposed on the same layer in the first non-active area NA1 and the second non-active area NA2 are used for different purposes, the noise by the signal line SL for the second touch routing line TL2 disposed in the non-planarized area of the encapsulation part ENCAP may be reduced, and the resistance of the first touch routing line TL1 disposed in the planarized area of the encapsulation part ENCAP may be decreased.

In some cases, the noise by the signal line SL in the overall non-active area NA may be reduced by placing a configuration for blocking the noise by the signal line SL in the non-planarized area of the encapsulation part ENCAP under the encapsulation part ENCAP.

As an example, referring to FIG. 16, a multi-buffer layer MB and an active buffer layer AB may be disposed on the substrate SUB. An active layer ACT may be disposed on the active buffer layer AB, and a gate insulation layer GI may be disposed on the active layer ACT.

A first metal M1 constituting the signal line SL or electrodes of the circuit elements disposed on the display panel DISP may be disposed on the gate insulation layer GI, and the first metal M1 may be a metal constituting the gate electrode of the thin film transistor disposed in the subpixel SP, as an example.

A first insulation layer INS1 may be disposed on the first metal M1, and a second metal M2 may be disposed on the first insulation layer INS1. The second metal M2 may be a metal for forming the storage capacitor Cst in the subpixel SP, as an example.

A second insulation layer INS2 may be disposed on the second metal M2, and a third metal M3 may be disposed on the second insulation layer INS2. The third metal M3 may be a metal constituting, e.g., the source or drain electrode of the thin film transistor.

A planarization layer PLN may be disposed on the third metal M3, and the first electrode E1 constituting the light emitting element ED may be disposed on the planarization layer PLN. The light emitting layer EL and the bank BANK may be disposed, and the second electrode E2 and the encapsulation part ENCAP may be disposed.

The touch electrode TE and the touch routing line TL may be disposed on the encapsulation part ENCAP.

In the first non-active area NA1, the shielding electrode SE may be disposed between the encapsulation part ENCAP and the signal line SL.

The shielding electrode SE may be electrically connected with the second electrode E2 which is the cathode electrode of the light emitting element ED disposed in the active area AA. The shielding electrode SE may be disposed on the same layer as the first electrode E1 which is the anode electrode of the light emitting element ED and be formed of the same material as the first electrode E1.

Since the shielding electrode SE is disposed between the signal line SL and the first touch routing line TL1 in the first non-active area NA1, the noise by the signal line SL may be blocked by the shielding electrode SE.

The shielding electrode SE may be electrically connected with a common voltage supply line CVL that supplies the base voltage Vss to the second electrode E2 of the light emitting element ED. By the connection structure of the common voltage supply line CVL and the shielding electrode SE, the shielding electrode SE may be positioned on the top and side of the signal line SL.

Thus, the shielding electrode SE may block influence, by the signal line SL noise, on the touch routing line TL in the vertical or diagonal direction.

As such, in the planarized area of the encapsulation part ENCAP, the shielding electrode SE may be disposed under the encapsulation part ENCAP to block the signal line SL noise and, in the non-planarized area of the encapsulation part ENCAP, the shielding pattern SPTN may be disposed on the encapsulation part ENCAP to block the signal line SL noise.

In particular, in the non-planarized area of the encapsulation part ENCAP, it may be not easy to place the shielding electrode SE formed of the same material as the first electrode E1 of the light emitting element ED due to the inclined structure of the encapsulation part ENCAP. Thus, noise is blocked using the shielding pattern SPTN positioned on the encapsulation part ENCAP in the non-planarized area of the encapsulation part ENCAP. Thus, the signal line SL noise may be effectively reduced in the non-active area NA.

Further, the metal disposed on the same layer as the shielding pattern SPTN in the planarized area of the encapsulation part ENCAP may be connected with the first touch routing line TL1 to be used as the auxiliary routing line STL, thereby reducing the resistance of the first touch routing line TL1 disposed in the first non-active area NA1.

In this case, since the resistance of the first touch routing line TL1 disposed in the first non-active area NA1 is reduced, the planarized area of the encapsulation part ENCAP may be decreased by reducing the width of the first touch routing line TL1.

Referring to FIG. 17, the first touch routing line TL1 may be disposed in the first non-active area NA1 which is the planarized area of the encapsulation part ENCAP, and the shielding electrode SE may be disposed under the encapsulation part ENCAP.

In the planarized area of the encapsulation part ENCAP, the encapsulation part ENCAP has a constant thickness, and the shielding electrode SE is disposed. Thus, the influence on the first touch routing line TL1 by the noise due to the signal line SL positioned under the encapsulation part ENCAP may be blocked off.

Thus, the metal disposed under the first touch routing line TL1 in the first non-active area NA1 may be electrically connected with the first touch routing line TL1 and be used as the auxiliary routing line STL.

The shielding pattern SPTN may be disposed between the encapsulation part ENCAP and the second touch routing line TL2 disposed in the second non-active area NA2 which is the non-planarized area of the encapsulation part ENCAP.

The shielding pattern SPTN may be disposed not to overlap the touch routing line STL. The shielding pattern SPTN may receive a constant voltage and form an electric field, thereby blocking the noise due to the signal line SL.

The first touch routing line TL1 disposed in the first non-active area NA1 may be connected with the touch electrode TE positioned in an area relatively close to the touch driving circuit TDC. The second touch routing line TL2 disposed in the second non-active area NA2 may be connected with the touch electrode TE positioned in an area relatively distant from the touch driving circuit TDC.

Thus, the length of the first touch routing line TL1 may be smaller than the length of the second touch routing line TL2, and the resistance of the first touch routing line TL1 may be smaller than the resistance of the second touch routing line TL2. Since the first touch routing line TL1 is connected with the auxiliary routing line STL, the difference between the resistance of the first touch routing line TL1 and the resistance of the second touch routing line TL2 may become larger.

Thus, it is possible to reduce the resistance difference between the first touch routing line TL1 and the second touch routing line TL2 by making the width W1 of the first touch routing line TL1 smaller than the width W2 of the second touch routing line TL2.

The size of the first non-active area NA1 where the first touch routing line TL1 is disposed may be reduced by decreasing the width of the first touch routing line TL1.

It is thus possible to place the touch routing line TL while reducing the non-active area NA by reducing the planarized area of the encapsulation part ENCAP for placing the touch routing line while allowing for placement of the touch routing line in the non-planarized area of the encapsulation part ENCAP by the shielding pattern SPTN.

The shielding pattern SPTN disposed under the touch routing line TL in the non-active area NA may be disposed not to overlap the touch routing line TL. However, in some cases, a portion of the metal connected with the shielding pattern SPTN may overlap the touch routing line TL.

Figure 18A:
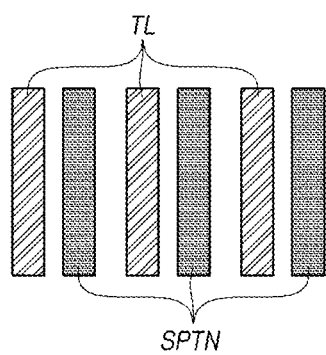
FIGS. 18A and 18B are plan views illustrating a specific structure of a shielding pattern and a touch routing line as shown in FIGS. 16 and 17 according to an embodiment.
Figure 18B:
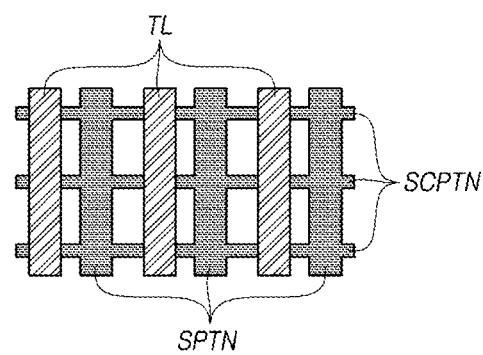

FIGS. 18A and 18B are plan views illustrating a specific structure of a shielding pattern SPTN and a touch routing line TL as shown in FIGS. 16 and 17.

Referring to FIG. 18A, the shielding pattern SPTN may be disposed not to overlap the touch routing line TL. The same constant voltage may be applied to multiple shielding patterns SPTN separated from each other.

Thus, an electric field may be formed by the shielding pattern SPTN, thereby blocking the noise due to the signal line SL positioned under the encapsulation part ENCAP. Further, since the shielding pattern SPTN is disposed not to overlap the touch routing line TL, it is possible to reduce parasitic capacitance which would otherwise occur between the shielding pattern SPTN and the touch routing line TL.

In some cases, the shielding pattern SPTN disposed under the touch routing line TL may have a mesh structure as shown in FIG. 18B.

As an example, the shielding pattern SPTN may be disposed along the same direction as the direction in which the touch routing line TL is disposed, and a shielding connection pattern SCPTN may be disposed in a direction crossing the touch routing line TL. The shielding patterns SPTN may be connected by the shielding connection pattern SCPTN.

The mesh structure formed by the shielding pattern SPTN and the shielding connection pattern SCPTN allows a strong electric field to be formed by, e.g., the shielding pattern SPTN. Thus, it is possible to increase the performance of shielding the noise due to the signal line SL.

Since the shielding patterns SPTN are connected by the shielding connection pattern SCPTN, the lines for supplying signals to the shielding patterns SPTN may be simplified.

It is possible to reduce noise due to the parasitic capacitance between the shielding connection pattern SCPTN and the touch routing line TL, although a portion of the shielding connection pattern SCPTN overlaps the touch routing line TL, by making the width of the shielding connection pattern SCPTN smaller than the width of the shielding pattern SPTN.

The shielding pattern SPTN disposed in the non-active area NA may be disposed in the area overlapping the touch routing line TL, blocking the noise due to the signal line SL.

Figure 19:
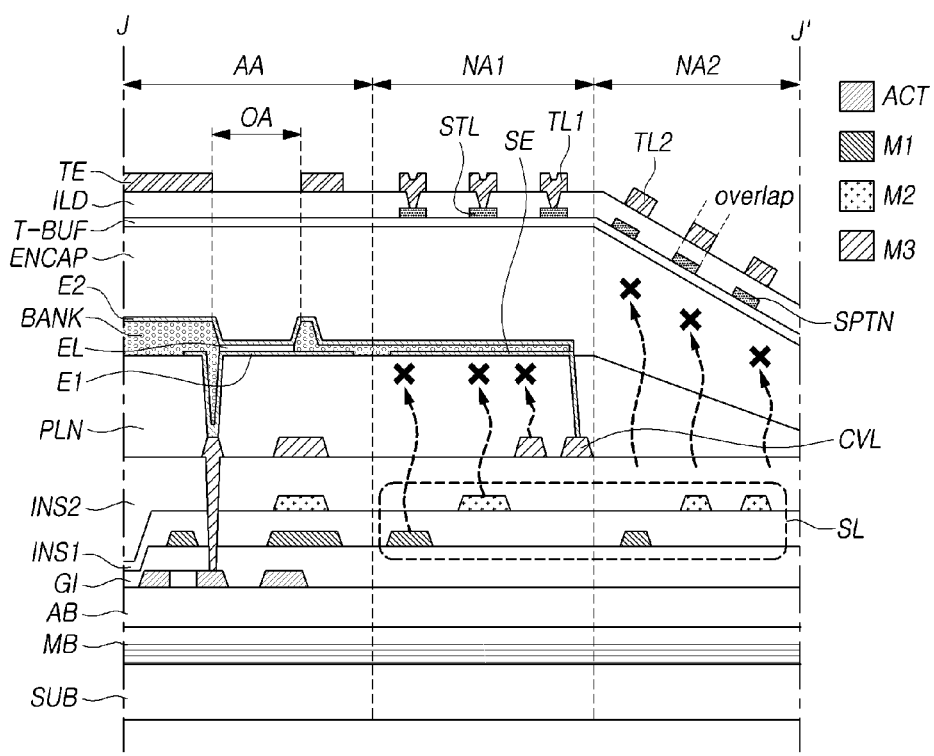
FIGS. 19 and 20 are cross-sectional view illustrating an example structure, taken along line J-J' of FIG. 15 according to an embodiment.
Figure 20:
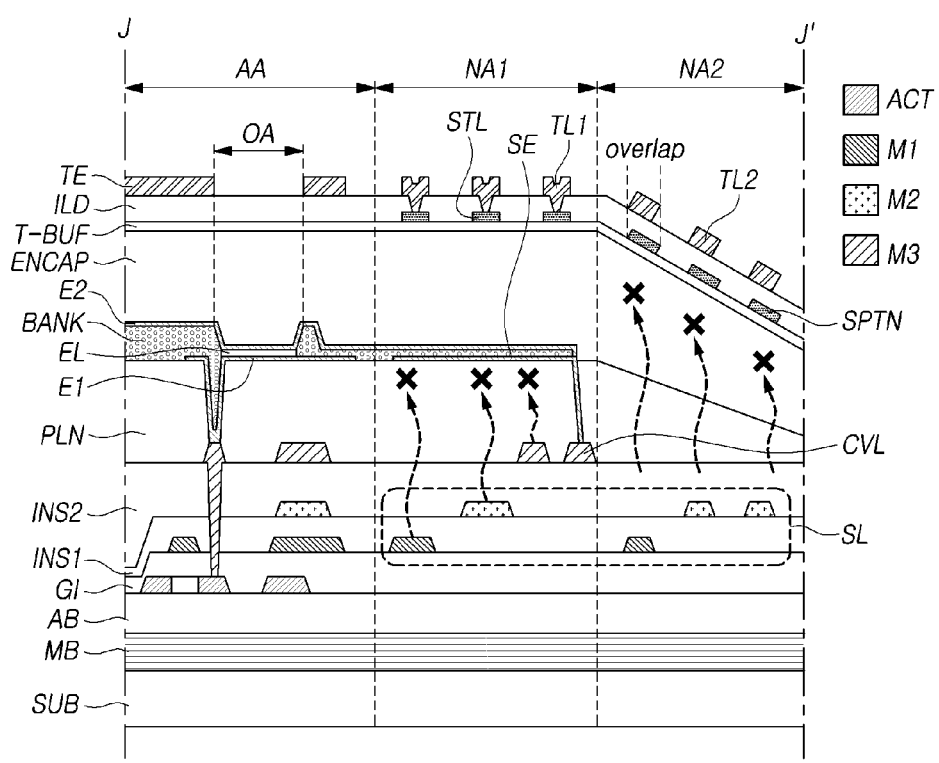

FIGS. 19 and 20 are cross-sectional view illustrating an example structure, taken along line J-J' of FIG. 15.

Referring to FIGS. 19 and 20, the first touch routing line TL1 disposed in the first non-active area NA1 which is the planarized area of the encapsulation part ENCAP may be electrically connected with the auxiliary routing line STL disposed on the encapsulation part ENCAP.

The shielding electrode SE may be disposed under the encapsulation part ENCAP in the first non-active area NA1. In some cases, if the noise due to the signal line SL is small in the planarized area of the encapsulation part ENCAP, the shielding electrode SE may not be placed.

The shielding pattern SPTN may be disposed between the encapsulation part ENCAP and the second touch routing line TL2 in the second non-active area NA2 which is the non-planarized area of the encapsulation part ENCAP.

The shielding pattern SPTN may be disposed in an area including the area overlapping the second touch routing line TL2.

As an example, as shown in FIG. 19, the shielding pattern SPTN may be disposed to overlap the second touch routing line TL2 in the direction perpendicular to the inclined surface of the encapsulation part ENCAP.

Alternatively, the shielding pattern SPTN may be disposed to overlap the second touch routing line TL2 in the direction perpendicular to the signal line SL as shown in FIG. 20.

A signal corresponding to the signal applied to the second touch routing line TL2 may be applied to the shielding pattern SPTN.

Specifically, the shielding pattern SPTN may receive the signal corresponding to the signal applied to the second touch routing line TL2 overlapping the shielding pattern SPTN. Here, the corresponding signal may mean a signal which is identical, in at least one of frequency, amplitude, or phase, to the signal applied to the second touch routing line TL2. Or, the corresponding signal may mean the same signal as the signal applied to the second touch routing line TL2.

Thus, where the second touch routing line TL2 overlapping the shielding pattern SPTN is a line connected with the driving touch electrode, the touch driving signal may be supplied to the shielding pattern SPTN. Where the second touch routing line TL2 overlapping the shielding pattern SPTN is a line connected with the sensing touch electrode, the same voltage as the constant voltage applied to the sensing touch electrode may be supplied to the shielding pattern SPTN.

As the shielding pattern SPTN is disposed to overlap the second touch routing line TL2, it is possible to reduce direct parasitic capacitance from forming between the signal line SL and the second touch routing line TL2.

Since the shielding pattern SPTN forms no parasitic capacitance with the second touch routing line TL2, the noise due to the signal line SL may be reduced from acting as noise to the second touch routing line TL2 via the shielding pattern SPTN.

As such, the structure in which the shielding pattern SPTN overlaps the second touch routing line TL2 may also block the noise due to the signal line SL. The shielding pattern SPTN may be disposed in a stripe or mesh type as described above.

Figure 21A:
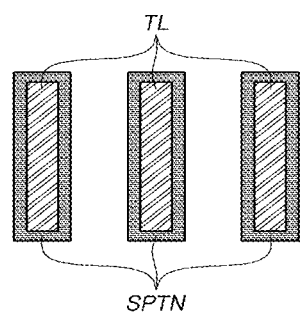
FIGS. 21A and 21B are plan views illustrating a specific structure of a shielding pattern and a touch routing line as shown in FIGS. 19 and 20 according to an embodiment.
Figure 21B:
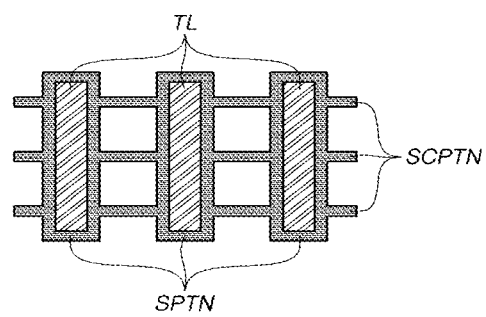

FIGS. 21A and 21B are plan views illustrating a specific structure of a shielding pattern SPTN and a touch routing line as shown in FIGS. 19 and 20.

Referring to FIG. 21A, the shielding patterns SPTN may be disposed separately from each other and to overlap the touch routing line TL. A signal corresponding to the signal applied to the touch routing line TL may be supplied to the shielding pattern SPTN.

Alternatively, the shielding pattern SPTN may be disposed to overlap the touch routing line TL as shown in FIG. 21B. Adjacent shielding patterns SPTN may be connected together by the shielding connection pattern SCPTN disposed in the direction crossing the shielding patterns SPTN.

The width of the shielding connection pattern SCPTN may be smaller or larger than the width of the shielding pattern SPTN and, in some cases, the shielding connection pattern SCPTN may be structured to fill up the areas between the shielding patterns SPTN. In other words, the shielding patterns SPTN may be overall disposed under the touch routing line TL.

As shown in FIG. 21B, in the structure in which the adjacent shielding patterns SPTN are connected together, the shielding patterns SPTN may receive a signal corresponding to the signal applied to the overlapping touch routing line TL.

Thus, the shielding patterns SPTN overlapping the touch routing lines TL, to which the same signal is supplied may be connected by the shielding connection pattern SCPTN, and the shielding patterns SPTN overlapping the touch routing lines TL, to which different signals are supplied, may be electrically separated from each other.

As such, even where the shielding patterns SPTN are disposed to overlap the touch routing lines TL, the shielding patterns SPTN may be arranged in various forms, blocking off the noise due to the signal line SL positioned under the encapsulation part ENCAP.

According to the above-described embodiments, it is possible to reduce the noise due to the signal line SL for display driving by placing the shielding pattern SPTN, which is positioned between the touch routing line TL and the encapsulation part ENCAP in the non-active area NA and does not overlap the touch routing line TL.

Thus, it is possible to place the touch routing line TL in the non-planarized area of the encapsulation part ENCAP, where the distance between the touch routing line TL and the signal line SL is small.

Further, as no shielding pattern SPTN is disposed in the planarized area of the encapsulation part ENCAP or the shielding electrode SE is disposed under the encapsulation part ENCAP, the metal disposed on the same layer as the shielding pattern SPTN on the encapsulation part ENCAP may be connected with the touch routing line TL and be used as the auxiliary routing line STL.

It is possible to reduce the planarized area of the encapsulation part ENCAP and the width of the touch routing line TL by reducing the resistance of the touch routing line TL disposed in the planarized area of the encapsulation part ENCAP by the auxiliary routing line STL.

Thus, it is possible to provide a touch display device for which the non-active area NA required for placing the touch routing line TL is reduced and the touch sensing signal noise upon display driving is reduced.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure. Thus, the scope of the disclosure is not limited to the embodiments shown, but is to be accorded the widest scope consistent with the claims. The scope of protection of the disclosure should be construed based on the following claims, and all technical ideas within the scope of equivalents thereof should be construed as being included within the scope of the disclosure.

What is claimed is:

1. A touch display device, comprising:
a plurality of light emitting elements arranged in an active area;
a plurality of signal lines arranged in a non-active area positioned outside the active area;
an encapsulation part disposed on the plurality of light emitting elements and the plurality of signal lines;
a plurality of touch electrodes arranged in the active area on the encapsulation part;
a plurality of touch routing lines arranged in the non-active area on the encapsulation part and electrically connected with the plurality of touch electrodes; and
at least one shielding pattern positioned between the plurality of touch routing lines and the encapsulation part, arranged in an area except for an area overlapping the plurality of touch routing lines, and to which a constant voltage is applied,
wherein the non-active area includes a first area positioned outside the active area and in which the encapsulation part is planarized and a second area positioned outside the first area and in which the encapsulation part is inclined, and at least a portion of the at least one shielding pattern is disposed in the second area, and
wherein a plurality of auxiliary routing lines are positioned between the plurality of touch routing lines and the encapsulation part, at least partially overlapping the plurality of touch routing lines, and electrically connected with the plurality of touch routing lines.

2. The touch display device of claim 1, wherein the at least one shielding pattern is disposed on a same layer as the plurality of auxiliary routing lines.

3. The touch display device of claim 1, wherein the plurality of touch routing lines arranged in the first area are smaller in width than the plurality of touch routing lines arranged in the second area.

4. The touch display device of claim 1, wherein the at least one shielding pattern is insulated from the plurality of touch routing lines.

5. The touch display device of claim 1, wherein the at least one shielding pattern includes a plurality of shielding patterns separated from each other, and wherein a same signal is applied to the plurality of shielding patterns.

6. The touch display device of claim 1, further comprising at least one shielding electrode positioned between the encapsulation part and the plurality of signal lines and electrically connected with cathode electrodes of the plurality of light emitting elements.

7. The touch display device of claim 6, wherein the at least one shielding electrode is disposed in an area including an area overlapping an area between the at least one shielding pattern and the active area.

8. The touch display device of claim 6, wherein the at least one shielding electrode is disposed in an area except form an area overlapping the at least one shielding pattern.

9. The touch display device of claim 6, wherein the at least one shielding electrode is disposed on a same layer as anode electrodes of the plurality of light emitting elements.

10. The touch display device of claim 1, further comprising at least one shielding connection pattern arranged in a direction crossing the at least one shielding pattern, connected with the at least one shielding pattern, and having a width not more than a width of the at least one shielding pattern.

11. A touch display device, comprising:
a plurality of light emitting elements arranged in an active area;
a plurality of signal lines arranged in a non-active area positioned outside the active area;
an encapsulation part disposed on the plurality of light emitting elements and the plurality of signal lines;
a plurality of touch electrodes arranged in the active area on the encapsulation part;
a plurality of touch routing lines arranged in the non-active area on the encapsulation part and electrically connected with the plurality of touch electrodes; and
at least one shielding pattern disposed between an inclined surface of the encapsulation part and the plurality of touch routing lines in the non-active area, disposed in an area including an area overlapping the plurality of touch routing lines, and to which a signal corresponding to a signal applied to the plurality of touch routing lines is applied,
wherein the signal applied to the at least one shielding pattern is the same as the signal applied to the plurality of touch routing lines overlapping the at least one shielding pattern.

12. The touch display device of claim 11, wherein the at least one shielding pattern is disposed in an area including the area overlapping the plurality of touch routing lines in a direction perpendicular to the inclined surface of the encapsulation part.

13. The touch display device of claim 11, wherein the at least one shielding pattern is disposed in an area including the area overlapping the plurality of touch routing lines in a direction perpendicular to the plurality of signal lines.

14. The touch display device of claim 11, further comprising a plurality of auxiliary routing lines arranged between the active area and the inclined surface of the encapsulation part, positioned between the plurality of touch routing lines and the encapsulation part, and electrically connected with the plurality of touch routing lines.

15. A touch display device, comprising:
a plurality of touch electrodes arranged in an active area;
a plurality of touch routing lines arranged in a non-active area positioned outside the active area and electrically connected with the plurality of touch electrodes;

a plurality of signal lines arranged in the non-active area and positioned under the plurality of touch routing lines; and at least one shielding pattern positioned between the plurality of touch routing lines and the plurality of signal lines, arranged in an area except for an area overlapping the plurality of touch routing lines, and to which a constant voltage is applied, wherein the non-active area includes a planarized area positioned outside the active area and an inclined area positioned outside the planarized area, and at least a portion of the at least one shielding pattern is disposed in the inclined area, and wherein the plurality of touch routing lines arranged in the planarized area are smaller in width than the plurality of touch routing lines arranged in the inclined area.

* * * * *